United States Patent
Mikura et al.

(10) Patent No.: US 7,479,862 B2
(45) Date of Patent: Jan. 20, 2009

(54) FERRITE MATERIAL AND CERAMIC SUBSTRATE

(75) Inventors: Tsutomu Mikura, Kirishima (JP); Kota Ikeda, Kirishima (JP); Koichi Nakahara, Kirishima (JP)

(73) Assignee: Kyocera Corporation, Kyoto (JP)

( * ) Notice: Subject to any disclaimer, the term of this patent is extended or adjusted under 35 U.S.C. 154(b) by 258 days.

(21) Appl. No.: 11/394,359

(22) Filed: Mar. 29, 2006

(65) Prior Publication Data

US 2007/0085121 A1    Apr. 19, 2007

(30) Foreign Application Priority Data

Mar. 29, 2005  (JP)  ............... P2005-96112
Feb. 22, 2006  (JP)  ............... P2006-045021

(51) Int. Cl.
*H01F 5/00*  (2006.01)

(52) U.S. Cl. ...................................................... 336/200

(58) Field of Classification Search ............ 336/65, 336/83, 200, 232, 233, 234
See application file for complete search history.

(56) References Cited

U.S. PATENT DOCUMENTS

| 5,482,907 A * | 1/1996 | Tuan et al. ............... 501/120 |
| 7,378,931 B2 * | 5/2008 | Odahara et al. ............ 336/200 |
| 2007/0003781 A1 * | 1/2007 | de Rochemont ............ 428/615 |

FOREIGN PATENT DOCUMENTS

| JP | 02-101714 | 4/1990 |
| JP | 06-020839 | 1/1994 |
| JP | 06-021264 | 1/1994 |
| JP | 06-333743 | 12/1994 |

* cited by examiner

*Primary Examiner*—Tuyen T. Nguyen
(74) *Attorney, Agent, or Firm*—Hogan & Hartson LLP

(57) ABSTRACT

A low-temperature firable ceramic substrate having formed in its inside a ferrite layer with a coil embedded therein is provided. The ferrite layer has a composition of 63 to 73% by mass of $Fe_2O_3$, 5 to 10% by mass of CuO, 5 to 12% by mass of NiO, and 10 to 23% by mass of ZnO. Even if firing is performed at a lower temperature than ever, it is possible to obtain a ferrite layer which is excellent in sintered density and magnetic permeability.

14 Claims, 10 Drawing Sheets

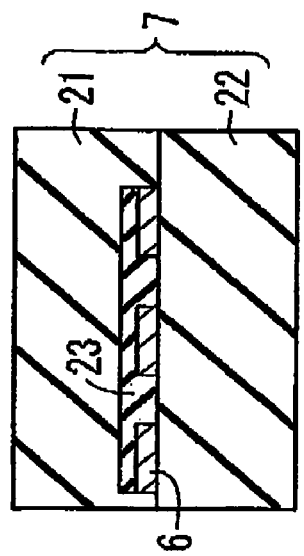
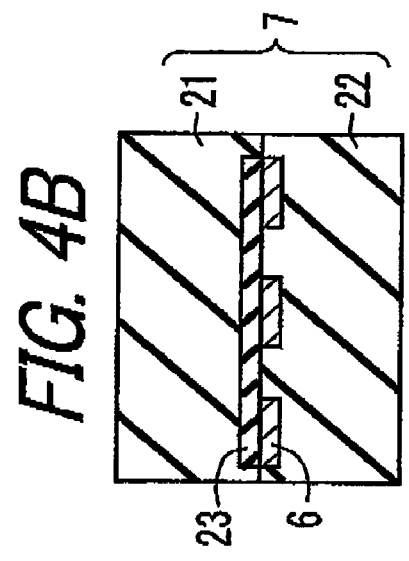
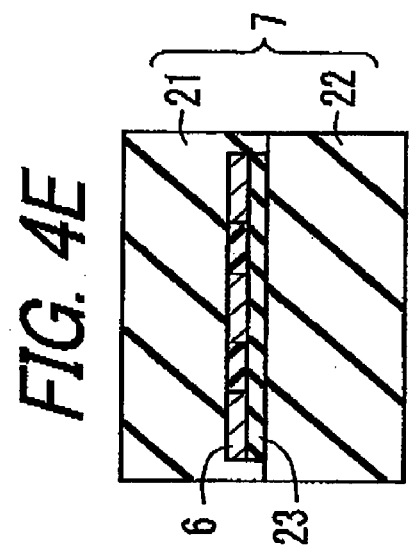
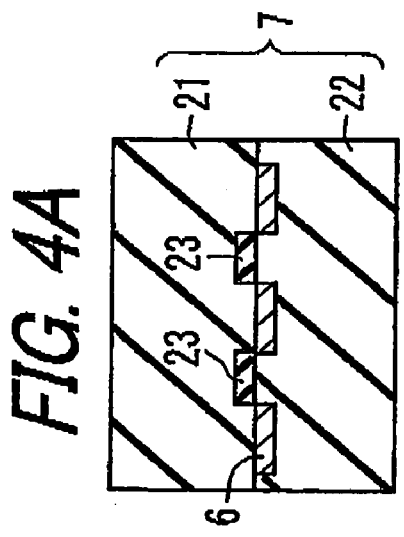
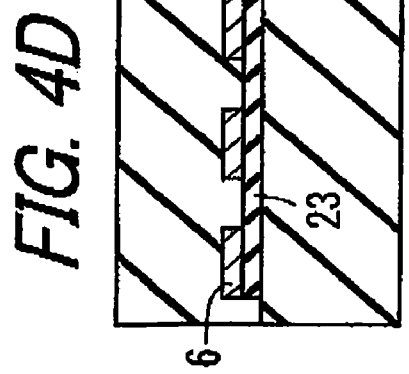
FIG. 4A  FIG. 4B  FIG. 4C  FIG. 4D  FIG. 4E  FIG. 4F

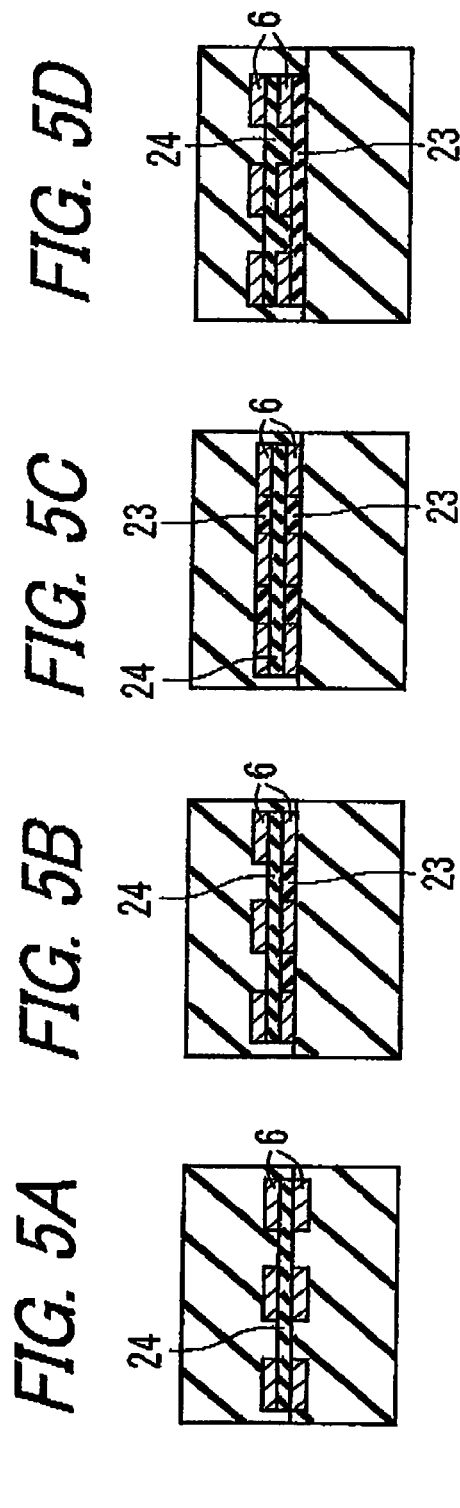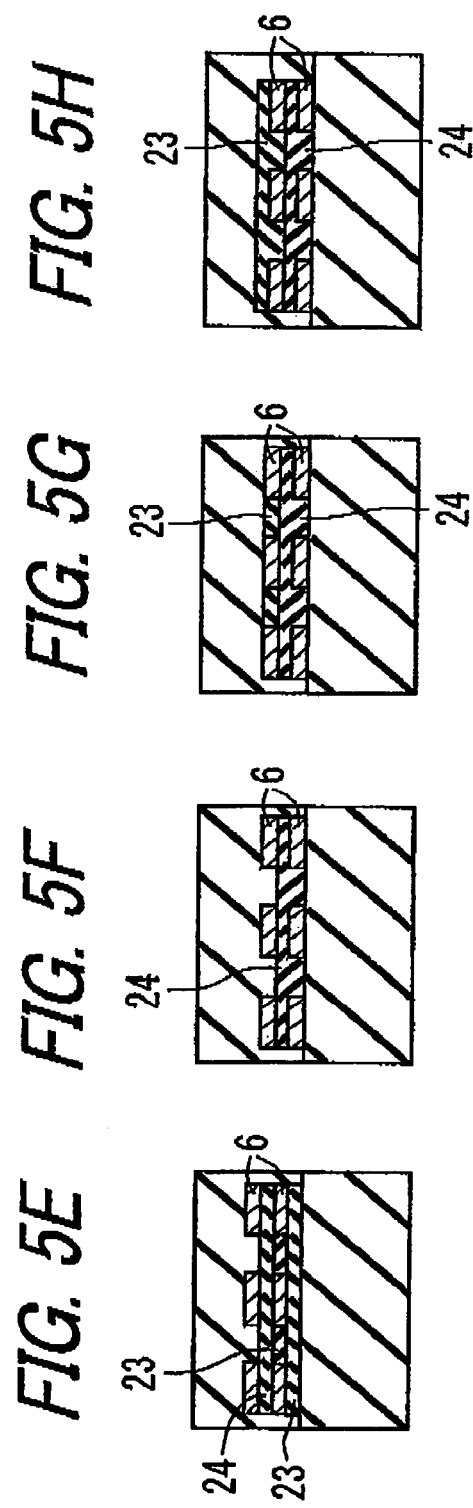

FERRITE MATERIAL AND CERAMIC SUBSTRATE

BACKGROUND OF THE INVENTION

1. Field of the Invention

The present invention relates to a ferrite material and a LTCC (Low Temperature Cofire Ceramic) substrate having formed in its inside a ferrite layer made of the ferrite material in which is embedded a coil-shaped conductor layer.

2. Description of the Related Art

To date electronic equipment such as a mobile communication apparatus, typified by a cellular telephone, has been designed to have a multiplicity of electronic devices incorporated therein. In recent years, communication apparatuses such as a cellular telephone have been becoming smaller in size so rapidly that downsizing and slimming have been sought after in various electronic devices designed to be mounted therein. For example, there is known an LC filter constructed by disposing a coil within a glass ceramic substrate. In the LC filter, in contrast to a conventional LC filter to which a coil, or a chip component is added externally, a coil is disposed inside an insulator substrate such as a ceramic substrate, wherefore both compactness and slimness can be achieved. In particular, a coil for providing an inductance of greater than 100 nH comes under the category of relatively large-sized chip components. Therefore, the success of inclusion of such a coil into an insulator substrate contributes significantly to a compact and slimmed-down LC filter. As coils designed to be incorporated in a ceramic substrate, there are known a solenoid coil and a planar spiral coil. The former is constructed by connecting coil elements in the direction of thickness of a ceramic substrate. The latter is composed of coplanar coil elements. The use of a planar spiral coil is especially desirable if the ceramic substrate is made lower in profile, because it is constructed by forming coil elements on the same plane.

Such a glass ceramic substrate is usually made extremely small in size, for example it is shaped like a plate of a few square millimeters. Moreover, in order to improve the ease-of-use of the glass ceramic substrate, as well as to produce the glass ceramic substrate and other electronic devices in an efficient manner, the glass ceramic substrate is formed out of a multiple-dividable motherboard. That is, a single wide-area motherboard is used to fabricate a plurality of glass ceramic substrates concurrently and collectively. To be more specific, the substantially flat-shaped motherboard is designed to have, at least on one of its upper and lower main surfaces, division grooves formed so as to extend longitudinally and transversely, so that the motherboard can be divided into a plurality of glass ceramic substrates. The motherboard is fractured along the division grooves to obtain a plurality of glass ceramic substrates.

However, in an insulator substrate such as a ceramic substrate having a built-in coil, the coil is formed within a non-magnetic substrate. Therefore, inclusion of such a coil as allows acquisition of a relatively high inductance of approximately 100 nH cannot be achieved without increasing the number of turns in the coil. This gives rise to the impossibility of achieving compactness and slimness for the substrate in an effective manner.

According to a recently known technique devised to overcome the above stated problem, a ferromagnetic ferrite layer is formed within a glass ceramic substrate, and a coil is buried in the ferromagnetic ferrite layer. In this way, a coil for providing an inductance of greater than 100 nH can be incorporated in the substrate without increasing the number of turns in the coil. This makes it possible to simplify a surface-mounting operation, as well as to achieve miniaturization for the glass ceramic substrate.

Note that, in fabricating such a glass ceramic substrate, in order for the ferrite layer and the glass ceramic insulating layer to be firmly bonded to each other by exploiting the diffusion of a glass element of the glass ceramic insulating layer in the ferrite layer, the ferrite layer and the glass ceramic insulating layer are fired at the same time.

Related art techniques are disclosed in Japanese Unexamined Patent Publications JP-A 2-101714 (1990), JP-A 6-20839 (1994), JP-A 6-21264 (1994), and JP-A 6-333743 (1994).

However, a glass ceramic substrate having a ferrite layer of conventional design has encountered the following problems.

The first problem is the low magnetic permeability of the ferrite layer interposed between the glass ceramic layers. In ordinary cases, the ferrite layer is fired at a temperature of greater than 1000° C. In the conventional construction, however, the ferrite layer is fired at a temperature in a range of from 800° C. to 1000° C., which is a firing temperature range set for the glass ceramic substrate. This necessitates adding a sintering aid to the ferrite layer, such as glass powder, $SiO_2$, and $Al_2O_3$. In general, the magnetic characteristics of a magnetic material such as ferrite are expressed in magnetic permeability ($\mu$) as an indication. If the magnetic material exhibits high magnetic permeability, a coil of high inductance can be used. However, in the presence of a non-magnetic substance, the magnetic material undergoes a decrease in magnetic permeability. The decrease of the magnetic permeability is proportional to the cube of the volume of the non-magnetic substance. In other words, the addition of the non-magnetic substance such as glass powder or other sintering aid to the ferrite layer results in creating a non-magnetic area in the ferrite layer. As a consequence, the ferrite density in the ferrite layer is decreased and this leads to poor magnetic permeability.

Furthermore, in the case of firing the ferrite layer and the glass ceramic insulating layer at one time, because of the significant difference in thermal expansion coefficient between the ferrite layer and the glass ceramic insulating layer, the ferrite layer is subjected to a stress in the course of firing, in consequence whereof there results magnetic distortion. This leads to an undesirable decrease in the magnetic permeability of the ferrite layer.

The second problem is spalling of the ferrite layer. That is, when the ferrite layer is increased in thickness to obtain a sufficiently high inductance, due to the stress resulting from the difference in thermal expansion coefficient between the ferrite layer and the glass ceramic substrate, the ferrite layer is prone to come off after the completion of firing.

The third problem is roughening of the glass ceramic substrate due to inadequate sintering. That is, in the case of firing the glass ceramic insulating layer and the ferrite layer of the glass ceramic substrate at the same time, the glass element of the ferrite layer and the glass element of the glass ceramic substrate are bound to each other, and thereby the ferrite layer is inhibited from shrinking under restraint of the glass ceramic insulating layer. As a consequence, the ferrite layer lying in the inside of the glass ceramic substrate cannot be sintered properly, thus causing undesired roughening. In this case, where the glass ceramic substrate is formed out of a multiple-dividable motherboard, since it is obtained by dividing the glass ceramic motherboard into pieces after the completion of firing, it follows that the roughened part resulting from inadequate sintering in the ferrite layer is exposed from the side surface of each individual glass ceramic substrate. If, for example, atmospheric moisture finds its way into the exposed part, the glass ceramic substrate becomes water-absorptive, which leads to deterioration of the electrical characteristics of the glass ceramic substrate, such as occurrence of a short circuit in the wiring conductor disposed in the inner layer of the glass ceramic substrate. After all, the glass ceramic substrate offers poor electrical reliability.

Meanwhile, ceramic substrates can be produced without using glass ceramic. For example, a plurality of ceramic layers are formed of non-magnetic ferrite. Then, a ferromagnetic ferrite layer is interposed in the ceramic layers and a coil is buried in the ferromagnetic ferrite layer, whereupon a ceramic substrate is fabricated.

The interposition of the magnetic ferrite layer in the non-magnetic ferrite layers is necessary for the following reason. In a case where a wiring is disposed directly on the surface of the ferrite layer, a high inductance is induced in the wiring, thus causing noise. This may possibly give rise to a circuitry malfunction. Accordingly, by forming a coil in the magnetic ferrite layer and disposing a wiring in the non-magnetic ferrite layer, it is possible to reduce the inductance of the wiring, and thereby avoid occurrence of a circuitry malfunction. However, the use of non-magnetic ferrite poses the following problems.

Firstly, in a conventional ceramic substrate constructed by forming a ferrite layer and a coil-shaped conductor layer inside a non-magnetic ferrite substrate, magnetic lines of force developed in the coil-shaped conductor layer are caused to radiate toward the exterior of the ceramic substrate. Because of the instability of the magnetic lines of force, the ferrite layer is liable to undergo magnetic saturation caused by a disturbance of the magnetic lines of force. Thus, upon application of a large current, there occurs a decrease in inductance; that is, the so-called superposition characteristics are impaired. Furthermore, the magnetic lines of force radiating toward the exterior of the ceramic substrate are liable to have an electrical influence on the semiconductor chip, chip component, and wiring mounted on the upper and lower surfaces of the ceramic substrate, thus causing a circuitry malfunction.

In order to prevent the magnetic lines of force developed in the coil-shaped conductor layer from electrically affecting the semiconductor chip, chip component, and wiring mounted on the upper and lower surfaces of the ceramic substrate, it is necessary to secure a sufficient distance between the coil-shaped conductor layer and the semiconductor chip, chip component, wiring. As a result, the ceramic substrate is increased in thickness as a whole, thus making it impossible to realize a slimmed-down substrate.

Secondly, in the conventional ceramic substrate constructed by forming a ferrite layer and a coil-shaped conductor layer inside a non-magnetic ferrite substrate, in a case where metallized wiring layers are formed on the surface or in the inside of the substrate, if the thickness of the non-magnetic ferrite layer constituting the insulator substrate is reduced to make the substrate smaller in size and lower in profile, a leakage current will occur between the metallized wiring layers. This is because the non-magnetic ferrite layer has a relatively low volume resistivity value of $1 \times 10^{10}$ Ωm or below.

SUMMARY OF THE INVENTION

The invention has been devised in view of the above-described problems with the conventional art, and accordingly its object is to provide a ferrite material that exhibits high magnetic permeability in a high frequency band and is firable together with a glass ceramic insulating layer at a lower temperature than ever. A ferrite material is desired which has a sintered density of 5 g/cm$^3$ or above and exhibits a magnetic permeability of 100 or above at 1.0 MHz and 10.0 MHz.

Another object of the invention is to provide a glass ceramic substrate having a ferrite layer made of the above-described low-temperature firable, high-magnetic permeability ferrite material in which is embedded a coil-shaped conductor layer that exhibits a high inductance with stability.

Still another object of the invention is to provide a small-sized ceramic substrate that succeeds in providing improved superposition characteristics by controlling properly magnetic lines of force developed in the coil-shaped conductor layer, in minimizing an electrical influence exerted on a semiconductor chip and a chip component mounted on the upper and lower surfaces of the ceramic substrate, and in reducing conductor resistance of the coil-shaped conductor layer.

The invention provides a ferrite material formed of ferrite containing $Fe_2O_3$, CuO, NiO, and ZnO, wherein the following formulae are satisfied:

$$63 \leq a \leq 73,$$

$$5 \leq b \leq 10,$$

$$5 \leq c \leq 12,$$

$$10 \leq d \leq 23,$$

and $$a+b+c+d \leq 100,$$

where a content of $Fe_2O_3$ is a % by mass, a content of CuO is b % by mass, a content of NiO is c % by mass, and a content of ZnO is d % by mass.

According to the invention, the ferrite material is formed of NiCuZn ferrite, namely a combination of low-temperature firable CuZn ferrite and NiZn ferrite which is excellent in high-frequency band characteristics. In this case, the ferrite material can be fired at a temperature in a range of from 800° C. to 1000° C., which is a firing temperature range set for a glass ceramic substrate, without the necessity of adding a sintering aid such as glass powder, $SiO_2$, and $Al_2O_3$. As a result, it never occurs that a non-magnetic area is created in the ferrite material, wherefore the ferrite material is free from a decrease in magnetic permeability and thus exhibits sufficiently high magnetic permeability in a high-frequency band.

The invention provides a ceramic substrate comprising:

a plurality of ceramic layers formed of a non-magnetic material;

a ferrite layer formed of the ferrite material that is interposed in the plural ceramic layers; and a coil-shaped conductor layer embedded in the ferrite layer.

According to the ceramic substrate of the invention, being formed of the aforestated ferrite material, the ferrite layer can be fired together with a glass ceramic substrate without the necessity of adding a sintering aid such as glass powder, $SiO_2$, and $Al_2O_3$. Moreover, the ferrite layer exhibits sufficiently high magnetic permeability in a high frequency band. Accordingly, it is possible to produce a glass ceramic substrate having a built-in coil for providing a high inductance.

In the ceramic substrate of the invention, it is preferable that a ferrite portion located inwardly from an innermost part of the coil-shaped conductor layer as well as a ferrite portion located outwardly from an outermost part of the coil-shaped conductor layer is greater in magnetic permeability than a ferrite portion located between the adjacent parts of the coil-shaped conductor layer, when viewed in a plane-wise direction.

According to the ceramic substrate of the invention, a magnetic flux generated in each portion of the coil-shaped conductor layer travels toward a ferrite layer portion having higher magnetic permeability, thus causing a large magnetic flux which passes across the coil as a whole, with the magnetic flux generated between the adjacent parts of the coil-shaped conductor layer kept suppressed. This makes it possible to suppress partial magnetic-flux saturation resulting from the concentration of magnetic flux between the coil-shaped conductor layer patterns, and thereby avoid deterioration of the superposition characteristics.

In the ceramic substrate of the invention, it is preferable that an electromagnetic shielding layer is interposed between the ferrite layer and a ceramic layer adjoining to the ferrite layer.

According to the ceramic substrate of the invention, the magnetic lines of force developed in the coil-shaped conductor layer are confined in the region between the electromagnetic shielding layers located above and underneath the coil-shaped conductor layer, respectively. This makes it possible to prevent a magnetic flux from leaking to the exterior of the substrate, and thereby attain a higher inductance.

Moreover, since the electromagnetic shielding layer helps prevent the magnetic lines of force developed in the coil-shaped conductor layer from leaking to the upper and lower surfaces of the substrate, it never occurs that the magnetic lines of force developed in the coil-shaped conductor layer electrically affect a semiconductor chip, a chip component, and wiring mounted on the upper and lower surfaces of the ceramic substrate. It is thus no longer necessary to secure a sufficient distance between the coil-shaped conductor layer and the semiconductor chip, chip component, wiring. As a result, the ceramic substrate can be made smaller in size and lower in profile.

In the ceramic substrate of the invention, it is preferable that the electromagnetic shielding layers are so formed as to cover the coil in the direction of thickness of the substrate.

According to the ceramic substrate of the invention, the upper and lower surfaces of the coil-shaped conductor layer are covered completely by the electromagnetic shielding layers. Therefore, a semiconductor chip and a chip component mounted on the upper and lower surfaces of the ceramic substrate are not electrically affected by the magnetic lines of force generated in the coil-shaped conductor layer. As a result, occurrence of a circuitry malfunction in the ceramic substrate can be avoided more reliably.

In the ceramic substrate of the invention, it is preferable that the ferrite layer is so designed that its outer periphery is lower in void ratio than other part located inwardly from the outer periphery, as seen plane-wise.

According to the ceramic substrate of the invention, in the ferrite layer, the void ratio of the midportion is higher than the void ratio of the outer periphery. Correspondingly, the magnetic permeability of the midportion is lower than that of the outer periphery in the ferrite layer. This makes it possible to reduce magnetic flux leakage from the center of the substrate, and thereby minimize an adverse effect exerted on a surface-mounted component such as IC. Moreover, since the glass ceramic substrate is sintered satisfactorily at the individual outer edges, it is possible to prevent intrusion of e.g., atmospheric moisture into part of the ferrite layer which is exposed from the side surface of the substrate.

In the ceramic substrate of the invention, it is preferable that, in the ferrite layer, a plurality of coil-shaped conductor layers are arranged in a face-to-face manner, with a spacing secured therebetween, when viewed in the direction of thickness of the substrate, and that the plural coil-shaped conductor layers are electrically connected in parallel with each other.

According to the ceramic substrate of the invention, the conductor resistance of, for example, a pair of identically shaped, parallel-connected coil-shaped conductor layers is one-half that of a single coil-shaped conductor layer of the same shape. This makes it possible to suppress heat generation accompanied by application of electric current, and thereby allow passage of electric current of higher level. Accordingly, a high-current-output IC can be mounted on the substrate, wherefore the ceramic substrate can be put to a wide range of applications.

In the ceramic substrate of the invention, it is preferable that a ferrite portion that exists between the outermost part of each of the plural coil-shaped conductor layers and the innermost part of each of the plural coil-shaped conductor layers, when viewed in a plane-wise direction, as well as exists in a coil-forming region secured between the plural coil-shaped conductor layers, when viewed in a thickness-wise direction, is smaller in magnetic permeability than a ferrite portion that exists in other region than the coil-forming region of the ferrite layer.

According to the ceramic substrate of the invention, a magnetic flux generated in each of the plural coil-shaped conductor layers travels toward a ferrite layer portion having higher magnetic permeability, thus causing a large magnetic flux which passes across the coils as a whole, with the magnetic flux generated between the plural coil-shaped conductor layers kept suppressed. This makes it possible to suppress partial magnetic-flux saturation resulting from the concentration of magnetic flux between the plural coil-shaped conductor layers, and thereby avoid deterioration of the superposition characteristics.

In the ceramic substrate of the invention, it is preferable that the coil-shaped conductor layer is predominantly composed of at least one kind of metal selected from among Cu, Ag, Au, Pt, Al, Ag—Pd alloy, and Ag—Pt alloy.

The ceramic substrate of the invention is firable at a lower temperature than ever. Therefore, among low-resistance metal materials including Cu, Ag, Au, Pt, Al, Ag—Pd alloy, and Ag—Pt alloy, at least one kind of metal can be used for forming the coil-shaped conductor layer. This makes it possible to suppress heat generation accompanied by application of electric current more reliably, and thus produce a high-performance, low-power loss ceramic substrate that is adaptable to a high-frequency band.

In the ceramic substrate of the invention, it is preferable that the ferrite layer is formed of non-magnetic ferrite, and that on the outer surface of the ceramic layer is formed a metallized wiring layer made of a material containing divalent metal oxide as an additional constituent.

According to the ceramic substrate of the invention, on the outer surface of the non-magnetic ferrite later acting as an insulating layer is formed the metallized wiring layer made of a material containing divalent metal oxide as an additional constituent. With the addition of divalent metal oxide to the material, the metallized wiring layer and the insulating layer can be bonded to each other more tightly. As a reason for this, it seems likely that, when divalent metal oxide contained in the metallized wiring layer and a ferrite element contained in the insulating layer are bound to each other during firing, for example, a mechanically tough spinel structure is created at the interface between the metallized wiring layer and the insulating layer, which results in high bonding strength. As a result, even if the ceramic substrate is subjected to an external force, the insulating layer formed of non-magnetic ferrite located immediately below the metallized wiring layer can be protected from damage, wherefore a semiconductor chip and a chip component mounted on the upper and lower surfaces of the ceramic substrate can be prevented from coming off in an effective manner. It is thus possible to produce a ceramic substrate on which a semiconductor chip and a chip component can be mounted with high mounting reliability.

In the ceramic substrate of the invention, it is preferable that the metallized wiring layer is composed of at least one kind of metal selected from among Cu, Ag, Au, Pt, Al, Ag—Pd alloy, and Ag—Pt alloy as a major constituent, and at least one kind of metal oxide selected from CuO and ZnO as an additional constituent.

According to the ceramic substrate of the invention, the metallized wiring layer is composed of low-resistance metal and at least one of non-magnetic CuO and ZnO. In this case, it is possible to avoid an undesirable increase in inductance, and thereby reduce the possibility of occurrence of noise. Accordingly, a semiconductor chip and a chip component mounted on the ceramic substrate are less affected electrically. As another advantage, when divalent metal oxide and ferrite are bound to each other during firing, a mechanically tough spinel structure is created at the interface between the metallized wiring layer and the non-magnetic ferrite layer, which results in an increase in the mechanical strength of the metallized wiring layer.

In the ceramic substrate of the invention, it is preferable that the metallized wiring layer is made of a material containing CuO or ZnO as an additional constituent, and that the content of CuO or ZnO is adjusted to fall in a range of from 5 to 15 parts by mass with respect to 100 parts by mass of the major-constituent metal.

In the ceramic substrate of the invention, it is preferable that the metallized wiring layer is made of a material containing CuO and ZnO as additional constituents, and that the content of CuO plus ZnO is adjusted to fall in a range of from 5 to 15 parts by mass with respect to 100 parts by mass of the major-constituent metal.

According to the ceramic substrate of the invention, in the metallized wiring layer, CuO, ZnO, or CuO plus ZnO is added in from 5 to 15 parts by mass with respect to 100 parts by mass of the major-constituent metal. This makes it possible to increase remarkably the strength of bonding between the metallized wiring layer and the insulating layer, and thereby produce a ceramic substrate on which a semiconductor chip and a chip component can be mounted with higher mounting reliability. Moreover, the electrical resistance of the metallized wiring layer can be prevented from being on the rise.

In the ceramic substrate of the invention, it is preferable that the ceramic layer is made of glass ceramic, that an intermediary layer is interposed between the ferrite layer and the ceramic layer adjoining to the ferrite layer, and that the intermediary layer is formed of an electrical insulator composed of glass and the same constituent as that contained in the ferrite layer, the thermal expansion coefficient of which falls in between the thermal expansion coefficient of the ceramic layer and the thermal expansion coefficient of the ferrite layer.

According to the ceramic substrate of the invention, the glass ceramic insulating layer and the ferrite layer are bonded to each other via the intermediary layer formed of an electrically insulating layer composed of glass and the same ferrite constituent as that contained in the ferrite layer. In this case, a stress resulting from the difference in thermal expansion coefficient between the ferrite layer and the glass ceramic insulating layer can be alleviated by the electrically insulating layer having a thermal expansion coefficient which falls in between the thermal expansion coefficient of the glass ceramic insulating layer and that of the ferrite layer. As a result, an undesirable decrease in magnetic permeability caused by magnetic distortion can be suppressed, and also the ferrite layer and the glass ceramic insulating layer can be bonded to each other more securely.

In the ceramic substrate of the invention, it is preferable that the ceramic layer is made of glass ceramic, that an intermediary layer is interposed between the ferrite layer and the ceramic layer adjoining to the ferrite layer, and that the intermediary layer is formed of a sintered metal layer composed of glass and at least one kind of metal selected from among Cu, Ag, Au, Pt, Ag—Pd alloy, and Ag—Pt alloy.

According to the ceramic substrate of the invention, the glass ceramic insulating layer and the ferrite layer are bonded to each other via the intermediary layer formed of a sintered metal layer composed of glass and at least one kind of metal selected from among Cu, Ag, Au, Pt, Ag—Pd alloy, and Ag—Pt alloy. In this case, a stress resulting from the difference in thermal expansion coefficient between the ferrite layer and the glass ceramic insulating layer can be alleviated by plastic deformation of the sintered metal layer. As a result, an undesirable decrease in magnetic permeability caused by magnetic distortion can be suppressed, and also the ferrite layer and the glass ceramic insulating layer can be bonded to each other more securely.

BRIEF DESCRIPTION OF THE DRAWINGS

Other and further objects, features, and advantages of the invention will be more explicit from the following detailed description taken with reference to the drawings wherein:

FIGS. 4A through 4F are sectional views schematically showing varied positional relationships between a coil-shaped conductor layer and a third ferrite layer as shown in FIG. 2;

FIGS. 5A through 5H are sectional views schematically showing varied positional relationships among a plurality of coil-shaped conductor layers, the third ferrite layer, and a fourth ferrite layer as shown in FIG. 3;

DETAILED DESCRIPTION

Now, the ceramic substrate (hereafter occasionally referred to simply as "substrate") embodying the invention will be described in detail with reference to the accompanying drawings.

Figure 1:
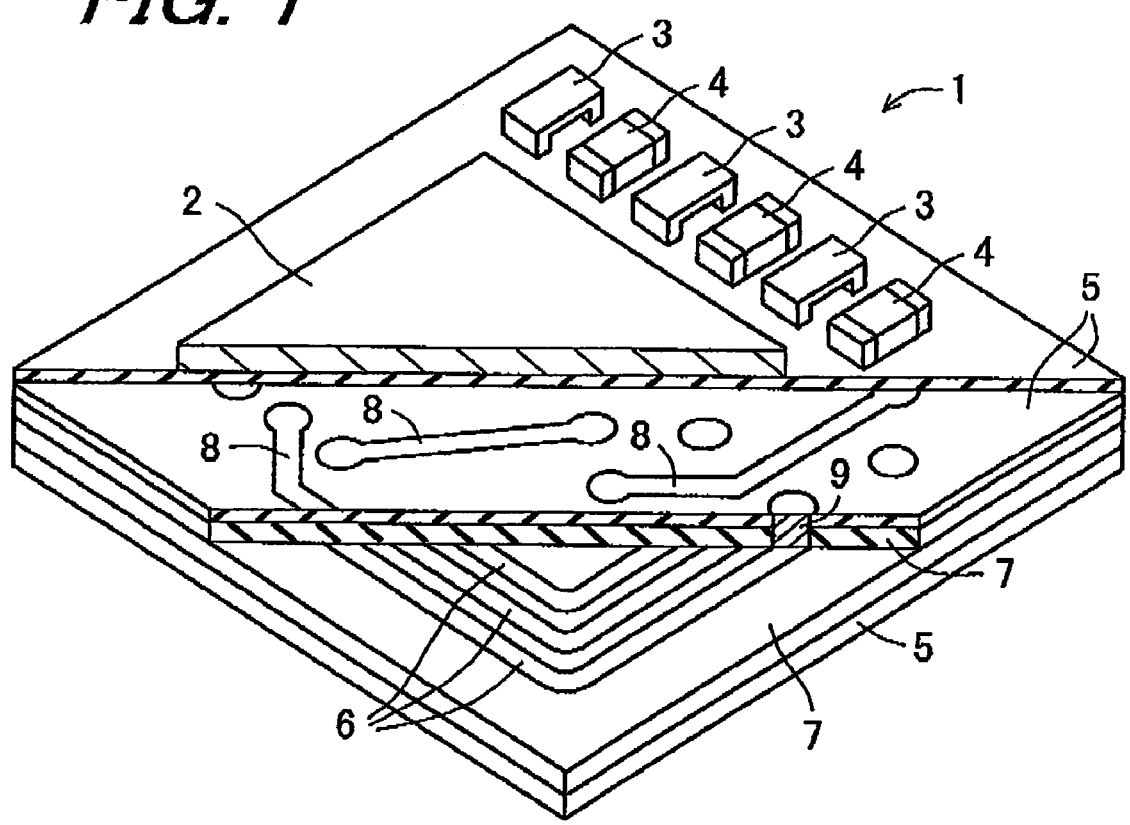
FIG. 1 is a cutaway perspective view schematically showing a ceramic substrate in accordance with one embodiment of the invention.

FIG. 1 is a cutaway perspective view schematically showing a ceramic substrate 1 in accordance with one embodiment of the invention. On an upper surface of the ceramic substrate 1 shown in FIG. 1 are mounted an IC chip 2, resistors 3, and capacitors 4.

In FIG. 1, the ceramic substrate 1 comprises a plurality of ceramic layers 5 made of a non-magnetic material; a ferrite layer 7 interposed between the ceramic layers 5; a coil-shaped conductor layer 6 embedded in the ferrite layer 7; and a wiring pattern layer 8 formed between the ceramic layers 5 as well as on the uppermost ceramic layer 5. In addition, an interlayer conductor path 9 is formed for providing connection among a plurality of the wiring pattern layers 8 in the direction of the thickness of the substrate. As preferred materials for forming the non-magnetic ceramic layer 5, LTCC (Low Temperature Cofire Ceramic) such as glass ceramic and non-magnetic ferrite can be taken up.

Roughly speaking, the ceramic substrate 1 is fabricated as follows. At first a glass ceramic green sheet or a non-magnetic ferrite layer green sheet used for forming the ceramic layer 5 and a ferrite green sheet for forming the ferrite layer 7 are formed. Then, on the glass ceramic green sheet or non-magnetic ferrite layer green sheet, as well as on the ferrite green sheet, is print-coated a conductor paste for forming the wiring pattern layer 8 and the coil-shaped conductor layer 6. Moreover, in order to create the interlayer conductor path 9, the ceramic green sheet is provided with a hole in which is filled a conductor paste. Lastly, a plurality of the green sheets are stacked together, and the stack is fired in an air atmosphere or a humid nitrogen atmosphere at a temperature in a range of from 800 to 1000° C.

Figure 2:
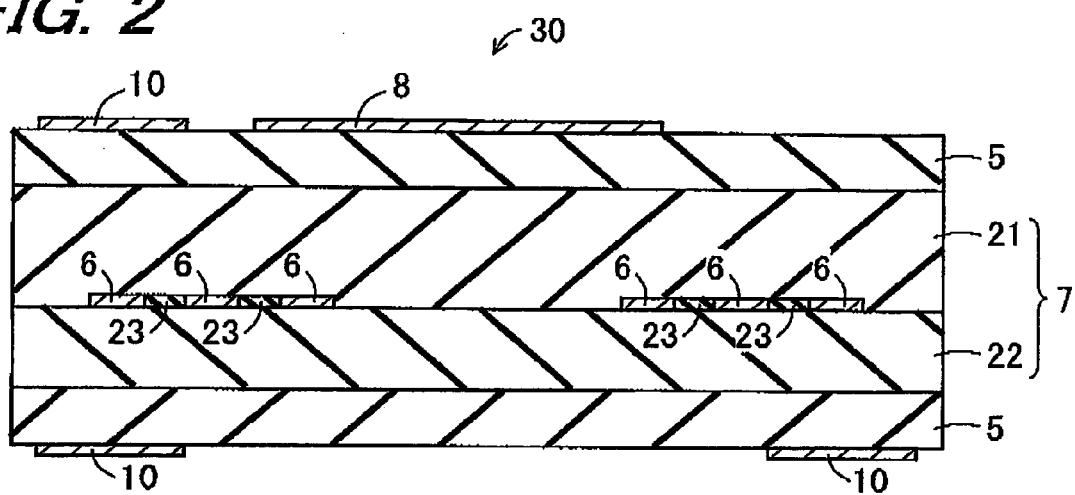
FIG. 2 is a sectional view schematically showing the constitution of a ceramic substrate whose ceramic layer, such as depicted in FIG. 1, is made of non-magnetic ferrite.

A description will be given below as to the constituent components of the ceramic substrate 1 shown in FIG. 1. FIG. 2 is a sectional view schematically showing the constitution of a ceramic substrate 30 whose ceramic layer 5, such as depicted in FIG. 1, is made of non-magnetic ferrite. In FIG. 2, the ceramic substrate 30 comprises a magnetic ferrite layer 7 having a coil-shaped conductor layer 6 buried therein; a plurality of non-magnetic ferrite layers 5 laminated on both sides of the magnetic ferrite layer 7 when viewed in a thickness-wise direction; and a wiring pattern layer 8 and an electrode pad 10 formed on the surface of the non-magnetic ferrite layer 5. The ferrite layer 7 is composed of a first ferrite layer 21 and a second ferrite layer 22. The first ferrite layer 21 is laminated on one side of the second ferrite layer 22 when viewed in a thickness-wise direction. The coil-shaped conductor layer 6 is interposed between the first ferrite layer 21 and the second ferrite layer 22. Moreover, when viewed in a plane-wise direction, between the adjacent coil-shaped conductor layer 6 portions is fitted a third ferrite layer 23 which is smaller in magnetic permeability than the first and second ferrite layers 21 and 22.

A plurality of the non-magnetic ferrite layers 5 are formed as follows. At first a major constituent of non-magnetic ferrite, glass, and the first oxide component, or a major constituent of non-magnetic ferrite, the first oxide component, glass, and the second oxide component, are blended together, with an organic binder, a plasticizer, an organic solvent, and the like added, to form a slurry. The slurry is then formed into non-magnetic ferrite green sheets by means of doctor blade method, rolling method, calender rolling method, or otherwise. Lastly, a plurality of the non-magnetic ferrite green sheets are stacked together, and the stack is fired in an air atmosphere or a humid nitrogen atmosphere at a temperature in a range of from 800 to 1000° C.

As the major constituent of non-magnetic ferrite, an admixture of $Fe_2O_3$ powder and at least one of CuO powder and ZnO powder is usable. For example, these powder materials are wet-blended and fired tentatively, and then pulverized into granules. In so doing raw material powder is prepared for use.

The major constituent of non-magnetic ferrite has preferably a composition of 46 to 50%, by mass, of $Fe_2O_3$, 2 to 20%, by mass, of CuO, and 33 to 52%, by mass, of ZnO.

It is preferable that the non-magnetic ferrite has a glass content of 3 to 15% by mass, and the glass element has a volume resistivity value of $1 \times 10^{11}$ Ωm or above. If the volume resistivity value of the glass element contained in the non-magnetic ferrite is smaller than $1 \times 10^{11}$ Ωm, the volume resistivity value of the non-magnetic ferrite cannot be increased effectively. Moreover, if the content of glass is less than 3% by mass, the volume resistivity value of the non-magnetic ferrite cannot be increased effectively. On the other hand, if the content of glass is greater than 15% by mass, the non-magnetic ferrite will undergo appreciable sintering-behavior variations and thus differ greatly in sintering-behavior than the first and second ferrite layers 21 and 22. Therefore, the non-magnetic ferrite layer 5 and the first and second ferrite layers 21 and 22 are liable to exert an arresting action on each other, thus causing a sintering failure in the first and second ferrite layers 21 and 22. As a consequence, for example, atmospheric moisture finds its way into the substrate; that is, the substrate becomes water-absorptive.

The specific examples of glass powder to be contained in the non-magnetic ferrite include: $SiO_2$—$B_2O_3$ base powder; $SiO_2$—$B_2O_3$—$Al_2O_3$ base powder; $SiO_2$—$B_2O_3$—$Al_2O_3$-MO base powder (M represents Ca, Sr, Mg, Ba, or Zn); $SiO_2$—$Al_2O_3$-$M^1O$-$M^2O$ base powder ($M^1$ and $M^2$ are either equal or unequal and indicate Ca, Sr, Mg, Ba, or Zn respectively); $SiO_2$—$B_2O_3$—$Al_2O_3$-$M^1O$-$M^2O$ base powder (the conditions for $M^1$ and $M^2$ are the same as above); $SiO_2$—$B_2O_3$-$M^3{}_2O$ base powder ($M^3$ represents Li, Na, or K); $SiO_2$—$B_2O_3$—$Al_2O_3$-$M^{23}O$ base powder (the condition for $M^3$ is the same as above); Pb base glass powder; and Bi base glass powder. It is desirable that the glass powder for use should have a softening point of 600° C. or below from the standpoint of ensuring satisfactory sintering of ferrite.

The first and second ferrite layers 21 and 22 are formed, together with the coil-shaped conductor layer 6, inwardly of the insulating layers so as to cover the upper and lower surfaces of the coil-shaped conductor layer 6. From the standpoint of stabilization in magnetic flux, the first ferrite layer 21 and the second ferrite layer 22 should preferably have the same composition. In a case where the major constituent of a ferrite material used for forming the first and second ferrite layers 21 and 22 has, as a sintered body, a composition of 63 to 73% by mass of $Fe_2O_3$, 5 to 10% by mass of CuO, 5 to 12% by mass of NiO, and 10 to 23% by mass of ZnO, then it is possible to achieve firing at a higher sintered density of 5.0 g/cm³ or above and at a lower temperature of 1000° C. or below.

Note that $Fe_2O_3$ is the principal component of ferrite. In a case where the ferrite material is predominantly composed of a solid solution having an inverse spinel structure given by: X—$Fe_2O_4$ (X represents Cu, Ni, Zn, etc.) the first and second ferrite layers 21 and 22 are preferably made to have a $Fe_2O_3$ content of 63 to 73% by mass. If the content of $Fe_2O_3$ is less than 63% by mass, there is a tendency that sufficiently high magnetic permeability cannot be attained. On the other hand, if the content of $Fe_2O_3$ is greater than 73% by mass, the mechanical strength is liable to decrease due to reduction in sintered density.

It is preferable that the major constituent of the ferrite material for forming the first and second ferrite layers 21 and 22 has a CuO content of 5 to 10% by mass. This is because CuO contributes significantly to the lowering of sintering temperature. To be more specific, CuO produces the effect of promoting a sintering process by creating a liquid layer at a low temperature. By exploiting such an effect, it is possible to fire the ferrite material at a temperature in a range of from 800 to 1000° C., which is a firing temperature range set for non-magnetic ferrite, without impairing the magnetic characteristics. If the content of CuO is less than 5% by mass, when the ferrite material is fired together with a wiring conductor made of low-resistance metal in a low temperature range, the mechanical strength is liable to decrease due to an inadequate sintered density. On the other hand, if the content of CuO is greater than 10% by mass, the proportion of low-magnetic $CuFe_2O_4$ will be increased correspondingly, wherefore the magnetic characteristics are liable to deteriorate.

The addition of NiO is necessary to ensure that the ferrite material exhibits desired magnetic permeability in a high frequency band. $NiFe_2O_4$ allows the magnetic permeability to be maintained at a relatively high value in a high frequency band without causing resonance-induced magnetic permeability attenuation. However, considering its low initial magnetic permeability, if the content of NiO is less than 5% by mass, the magnetic permeability tends to be on the decline at a high frequency of 10 MHz or above. On the other hand, if the content of NiO is greater than 12% by mass, the proportion of $NiFe_2O_4$ will be increased correspondingly, wherefore the initial magnetic permeability tends to be on the decline.

ZnO is a key element to improve the magnetic permeability of the ferrite material. If the major constituent of the ferrite material has a ZnO content of less than 10% by mass, the magnetic permeability is liable to decrease. On the other hand, if the content of ZnO is greater than 23% by mass, the magnetic characteristics are liable to deteriorate.

The first and second ferrite layers 21 and 22 are formed as follows. At first suitable organic binder, plasticizer, organic solvent, and the like are admixed in ferrite powder to form a slurry. The slurry is then formed into ferrite green sheets by means of doctor blade method, rolling method, calender rolling method, or otherwise. Subsequently, the ferrite green sheet is subjected to cutting in a manner such that it has the same size and shape as the non-magnetic ferrite green sheet as seen plane-wise, for covering the predetermined coil-shaped conductor layer 6 portions. Then, the ferrite green sheets are stacked together within the stacked body of the non-magnetic ferrite green sheets, with a conductor pattern to be formed into the coil-shaped conductor layer 6 arranged therebetween. The ferrite green sheets are placed so as to cover the upper and lower surfaces of the coil-shaped conductor layer 6.

The ferrite powder used for forming the ferrite green sheets which are formed into the first and second ferrite layers 21 and 22 is fired tentatively in advance. It is preferable that the ferrite powder has a uniform average particle diameter in a range of from 0.1 µm to 0.9 µm, the particle of which has a nearly spherical shape. If the average particle diameter is smaller than 0.1 µm, the ferrite powder particles cannot be scattered evenly in the course of manufacture of the ferrite green sheets. On the other hand, if the average particle diameter is greater than 0.9 µm, the sintering temperature of the ferrite material will have to be raised. Moreover, by virtue of the uniform particle size and nearly-spherical shape of the ferrite powder, the ferrite green sheet can be sintered uniformly on the whole. For example, if part of the powdery ferrite is smaller in particle diameter than average, the growth of crystal grain will be sluggish in this part, and thus the first and second ferrite layers 21 and 22 are liable to exhibit unstable magnetic permeability after the completion of sintering.

The coil-shaped conductor layer 6 formed of a metallized wiring layer is buried inside, the upper and lower surfaces of which are covered by the first and second ferrite layers 21 and 22. The coil-shaped conductor layer 6 is formed as follows. At first a conductor paste is prepared by kneading powdery metal such as Cu, Ag, Au, or Ag alloy with suitable organic binder and solvent. The conductor paste thus prepared is applied to the surface of the ferrite green sheet by means of screen printing, gravure printing, or the like technique. Then, the ferrite green sheet with the conductor paste is fired concurrently with the ceramic green sheet.

The third ferrite layer 23 which is lower in magnetic permeability than the first and second ferrite layers 21 and 22 is formed as follows. At first an electrically insulating powdery material having a low magnetic permeability selected from Zn base ferrite powder and Cu—Zn base ferrite powder is kneaded with a resin binder to form a paste. The low-magnetic permeability paste thus prepared is applied to the ferrite green sheet so as to cover substantially the entire upper surface of the coil-shaped conductor layer 6 by means of screen printing, gravure printing, or the like technique. Alternatively, a green sheet made of an electrically insulating material having a low magnetic permeability, such as Zn base ferrite and Cu—Zn base ferrite, is laminated on the ferrite green sheet so as to cover the upper surface of the coil-shaped conductor layer 6. Then, the ferrite green sheet with the low-magnetic permeability paste or the low-magnetic permeability green sheet is fired concurrently with the non-magnetic ferrite sheet, for example.

The wiring pattern layer 8 formed of a metallized wiring layer is formed on the surface of each of the non-magnetic ferrite layers 5 as follows. At first a conductor paste is prepared by kneading powdery metal such as Cu, Ag, Au, or Ag alloy with suitable organic binder and solvent. The conductor paste thus prepared is applied to the surface of the ceramic green sheet by means of screen printing, gravure printing, or the like technique.

The electrode pad 10 formed of a metallized wiring layer is electrically connected to an external electrical circuit. The electrode pad 10 is formed on at least one of the upper and lower surfaces of the ceramic substrate 1 as follows. At first a conductor paste is prepared by kneading powdery metal such as Cu, Ag, Au, or Ag alloy with suitable organic binder and solvent. The conductor paste thus prepared is applied to the surface of the ceramic green sheet by means of screen printing, gravure printing, or the like technique.

It is preferable that each of the wiring pattern layer 8 and the electrode pad 10 formed on the surface of the ceramic substrate 1 has its surface clad with a nickel layer and a gold layer successively by means of plating. This makes it possible to strengthen the bonding with a semiconductor chip, a chip component, and a wiring conductor of the external electrical circuit, which is achieved by soldering or otherwise.

It is also preferable that the metallized wiring layer constituting the wiring pattern layer 8 (hereafter occasionally referred to as "metallized wiring layer 8") and the electrode pad 10 formed on the surface of the non-magnetic ferrite layer 5 is made of a material containing divalent metal oxide as an additional constituent from the standpoint of the strength of bonding between the non-magnetic ferrite layer 5 and the metallized wiring layer 8. The preferred examples of divalent metal oxide include: CuO; ZnO; and CuO plus ZnO.

Although the reason why the addition of divalent metal oxide to the metallized wiring layer helps increase the strength of bonding between the wiring pattern layer 8 and the non-magnetic ferrite layer 5 composed predominantly of non-magnetic ferrite has yet to be clarified, it seems likely that, when divalent metal oxide and ferrite are bound to each other during firing, a mechanically tough spinel structure is created at the interface between the metallized wiring layer and the non-magnetic ferrite layer 5, which results in high bonding strength. By virtue of the addition of divalent metal oxide, even if the ceramic substrate 1 is subjected to an external force, the non-magnetic ferrite layer 5 located, immediately below the metallized wiring layer can be protected from damage. It is thus possible to produce a ceramic substrate on which a semiconductor chip and a chip component can be mounted with high mounting reliability.

Moreover, in forming the metallized wiring layer constituting the wiring pattern layer 8 and the electrode pad 10, divalent metal oxide is preferably contained only in the outer periphery of the surface-side metallized wiring layer. In this case, even if a stress is produced due to the difference in thermal expansion coefficient between the substrate and a surface-mounted component as well as an external wiring board connected thereto, since divalent metal oxide is contained in the end of the mounting pad at which the stress is concentrated, it never occurs that the mounting pad will come off from the wiring substrate. As another advantage, the mid-portion of the metallized wiring layer is free of divalent metal oxide, namely an electrical insulator, wherefore a low-resistance property can be attained.

The specific examples of divalent metal oxide include: ZnO; CuO; MgO; CoO; NiO; MnO; and FeO. Among them, non-magnetic CuO or ZnO offers the following advantage. In a case where the metallized wiring layer is made of low-resistance metal such as Cu, Ag, Au, or Ag alloy, with the addition of CuO or ZnO, it is possible to avoid an undesirable increase in inductance, and thereby reduce the possibility of occurrence of noise. Accordingly, the metallized wiring layer can be inhibited from exerting a significant electrical influence on a semiconductor chip and a chip component mounted on the substrate.

It is preferable that, in the metallized wiring layer, CuO, ZnO, or CuO plus ZnO is added in from 5 to 15 parts by mass with respect to 100 parts by mass of powdery metal such as Cu, Ag, Au, or Ag alloy. This makes it possible to increase remarkably the strength of bonding between the non-magnetic ferrite layer 5 and the metallized wiring layer, and thereby produce a ceramic substrate on which a semiconductor chip and a chip component can be mounted with higher mounting reliability.

If the content of CuO, ZnO, or CuO plus ZnO is less than 5 parts by mass, the strength of bonding between the non-magnetic ferrite layer 5 and the metallized wiring layer is liable to be inadequate. On the other hand, if the content of CuO, ZnO, or CuO plus ZnO is greater than 15 parts by mass, the electrical resistance of the metallized wiring layer is liable to increase after the completion of firing. For this reason, the metallized wiring layer should preferably contain, as divalent metal oxide, CuO, ZnO, or CuO plus ZnO in from 5 to 15 parts by mass with respect to 100 parts by mass of powdery metal such as Cu, Ag, Au, or Ag alloy.

Figure 3:
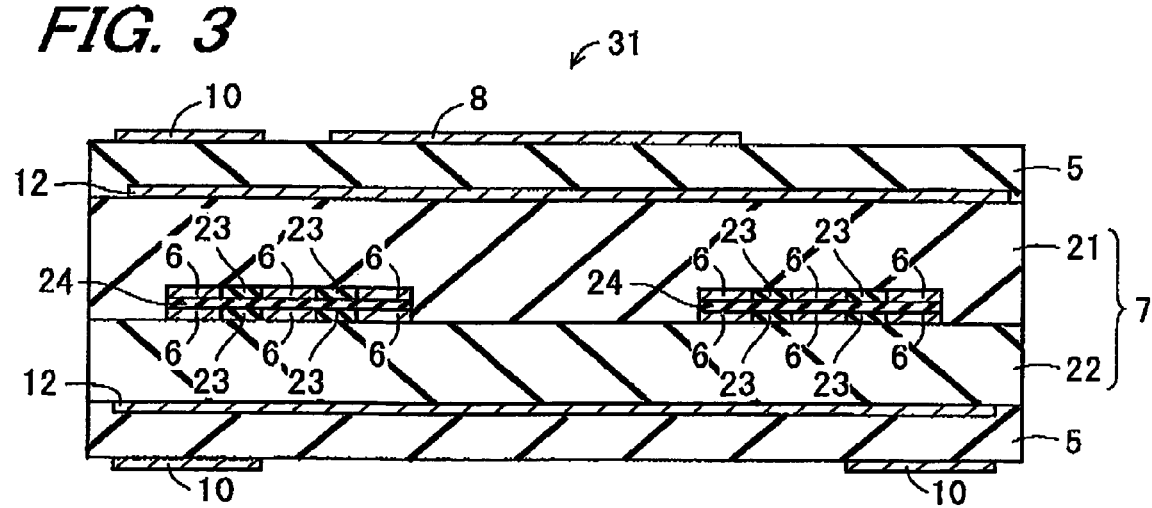
FIG. 3 is a sectional view schematically showing the constitution of the ceramic substrate in accordance with another embodiment of the invention.

FIG. 3 is a sectional view schematically showing the constitution of a ceramic substrate 31 implemented by way of another embodiment of the invention.

In FIG. 3, the ceramic substrate 31 includes, in addition to the constituent components of the ceramic substrate 30 depicted in FIG. 2, electromagnetic shielding layers 12 interposed between the first ferrite layer 21 and one non-magnetic ferrite layer 5 and between the second ferrite layer 22 and the other non-magnetic ferrite layer 5, respectively. Moreover, in the vicinity of the interface between the first ferrite layer 21 and the second ferrite layer 22 is disposed a pair of coil-shaped conductor layers 6. The paired coil-shaped conductor layers 6 are arranged in a face-to-face manner, with a spacing secured therebetween, when viewed in a thickness-wise direction. Also provided is a fourth ferrite layer 24 which is smaller in magnetic permeability than the first and second ferrite layers 21 and 22. When viewed in a plane-wise direction, the fourth ferrite layer 24 is formed between the outermost coil-shaped conductor layer 6 portion and the innermost coil-shaped conductor layer 6 portion, and, when viewed in a thickness-wise direction, it is formed in a coil-forming region secured between the paired coil-shaped conductor layers 6. Note that, in FIG. 3, the constituent components that play the same or corresponding roles as in FIG. 2 will be identified with the same reference designations, and overlapping descriptions will be omitted.

It is preferable that the coil-shaped conductor layers 6 formed of metallized wiring layers are arranged in a face-to-face manner in the thickness-wise direction, and that two or more coil-shaped conductor layers 6 are electrically connected in parallel with each other. For example, in FIG. 3, a pair of identically shaped conductor patterns are stacked together in the direction of the thickness of the substrate so as to form a pair of electrically parallel-connected coil-shaped conductor layers. In this case, the conductor resistance of the pair of identically shaped, parallel-connected coil-shaped conductor layers is one-half that of a single coil-shaped conductor layer. This makes it possible to suppress heat generation accompanied by application of electric current, and thereby allow passage of electric current of higher level. Accordingly, a high-current-output IC can be mounted on the substrate, wherefore the ceramic substrate can be put to a wide range of applications. The larger is the number of coil-shaped conductor layers to be connected in parallel with each other, the smaller is the resistance of the coil-shaped conductor layers. However, as the number of coil-shaped conductor layers is increased, the substrate is made larger in thickness correspondingly. It is thus necessary to determine the number of coil-shaped conductor layers in consideration of the desired thickness of the substrate.

It is also preferable that the interval between the two or more coil-shaped conductor layers is set at 100 μm or below. If the interval exceeds 100 μm, magnetic flux leakage tends to occur between the adjacent parallel-connected coil-shaped conductor layers 6. By suppressing the occurrence of magnetic flux leakage between the adjacent parallel-connected coil-shaped conductor layer patterns, it is possible to obtain as large a magnetic field as possible, and thereby generate a sufficiently large inductance.

As shown in FIG. 3, the fourth ferrite layer 24, which is smaller in magnetic permeability than the first and second ferrite layers 21 and 22, is interposed between the parallel-connected coil-shaped conductor layer 6 patterns. The fourth ferrite layer 24 may be formed by using a material similar to that used for forming the third ferrite layer 23. For example, an electrically insulating powdery material having a low magnetic permeability selected from Zn base ferrite powder and Cu—Zn base ferrite powder is kneaded with a resin binder to form a paste. The low-magnetic permeability paste thus prepared is applied to the ferrite green sheet so as to cover substantially the entire upper surface of the coil-shaped conductor layer by means of screen printing, gravure printing, or the like technique. Alternatively, a green sheet made of an electrically insulating material having a low magnetic permeability, such as Zn base ferrite and Cu—Zn base ferrite, is laminated on the ferrite green sheet so as to cover the upper surface of the coil-shaped conductor layer 6. Then, the ferrite green sheet with the low-magnetic permeability paste or the low-magnetic permeability green sheet is fired concurrently with the non-magnetic ferrite sheet, for example. In so doing there is formed the fourth ferrite layer 24.

The electromagnetic shielding layers 12 made of metallized wiring layers are interposed between the first ferrite layer 21 and one non-magnetic ferrite layer 5 and between the second ferrite layer 22 and the other non-magnetic ferrite layer 5, respectively, face to face with the coil-shaped conductor layer 6.

It is preferable that the electromagnetic shielding layers 12 made of metallized wiring layers are interposed between the first ferrite layer 21 and one non-magnetic ferrite layer 5 and between the second ferrite layer 22 and the other non-magnetic ferrite layer 5, respectively, in a manner such that the entire surfaces thereof cover the coil-shaped conductor layer 6 completely as seen plane-wise. In this way, the magnetic lines of force developed in the coil-shaped conductor layer 6 are shielded by the electromagnetic shielding layers 12, and thereby prevented from leaking to the exterior of the construction. Through stabilization of the magnetic lines of force, it is possible to improve the superposition characteristics satisfactorily, as well as to minimize the electrical influence exerted on a semiconductor chip and a chip component mounted on the upper and lower surfaces of the ceramic substrate.

The electromagnetic shielding layer 12 made of a metallized wiring layer is formed as follows. At first a conductor paste is prepared by kneading powdery metal such as Cu, Ag, Au, or Ag alloy with suitable organic binder and solvent. The conductor paste thus prepared is applied to the surface of the ceramic green sheet or the ferrite green sheet by means of screen printing, gravure printing, or the like technique. Then, the conductor paste and the ceramic green sheet or the ferrite green sheet carrying it are fired at one time.

FIGS. 4A through 4F are sectional views schematically showing varied positional relationships between the coil-shaped conductor layer 6 and the third ferrite layer 23 as shown in FIG. 2. On the other hand, FIGS. 5A through 5H are sectional views schematically showing varied positional relationships among a plurality of the coil-shaped conductor layers 6, the third ferrite layer 23, and the fourth ferrite layer 24 as shown in FIG. 3.

For example, the third ferrite layer 23 may be placed in accordance with any of the arrangement conditions as shown in FIGS. 4A through 4F. In the examples shown in FIGS. 4A and 4C, the low-magnetic permeability third ferrite layer 23 is so formed as to fill at least the gap between the conductor portions of the coil-shaped conductor layer 6. In this case, generation of magnetic flux can be suppressed between the conductor portions, thus making it possible to prevent occurrence of magnetic flux leakage in an effective manner. Specifically, in the example shown in FIG. 4A, for example, on the ferrite green sheet to be formed into the second ferrite layer 22 is placed the coil-shaped conductor layer 6 formed by means of printing technique. Then, the coil-shaped conductor layer 6 is pressed and buried into the ferrite green sheet. After that, a low-magnetic permeability paste is print-coated thereon so as to fill the gap between the conductor portions of the coil-shaped conductor layer 6. In so doing there is formed the third ferrite layer 23. On the other hand, in the example shown in FIG. 4C, for example, on the ferrite green sheet to be formed into the second ferrite layer 22 is placed the coil-shaped conductor layer 6 formed by means of printing technique. Then, a low-magnetic permeability paste is print-coated thereon so as to fill the gap between the conductor portions of the coil-shaped conductor layer 6. In so doing there is formed the third ferrite layer 23. If the gap between the conductor portions of the coil-shaped conductor layer 6 is so narrow that a low-magnetic permeability paste cannot be print-coated in an appropriate manner, as shown in FIGS. 4B and 4F, it is possible to apply a low-magnetic permeability paste over the entire surface of the coil-shaped conductor layer by means of printing technique. Also in this case there is formed the third ferrite layer 23 shaped so as to fill the gap between the conductor portions of the coil-shaped conductor layer 6. In this case, it would be better to make the third ferrite layer 23 lying on the coil-shaped conductor layer as thick as possible from the standpoint of avoiding generation of magnetic flux between the conductor portions. However, if the third ferrite layer 23 is made to have an unduly large thickness, the substrate will be increased in thickness correspondingly and thus cannot be made lower in profile. Accordingly, it is preferable that the thickness of the third ferrite layer 23 is adjusted to be substantially the same as that of the coil-shaped conductor layer. Depending upon the degree of the thickness of the coil-shaped conductor layer, at the time of laminating the ferrite green sheet to be formed into the first ferrite layer 21, a gap may be developed between the conductor portions of the coil-shaped conductor layer 6, with the result that delamination occurs around the gap, or a void is created therearound after the completion of firing. In order to prevent this, as shown in FIGS. 4B, 4C, 4E, and 4F, a combination of the coil-shaped conductor layer 6 and the third ferrite layer 23 should preferably be made to have substantially a flat upper surface.

Moreover, the third ferrite layer 23 and the fourth ferrite layer 24 may be placed in accordance with some of the arrangement conditions as shown in FIGS. 5A through 5H. The fourth ferrite layer 24 is placed between the parallel-connected coil-shaped conductor layer 6 patterns to reduce magnetic flux leakage which occurs in this region. Basically in the same manner as described above, the additional components such as the fourth ferrite layer 24 and another coil-shaped conductor layer 6 are so formed as to overlie the already-existing coil-shaped conductor layer 6 and the third ferrite layer 23 as shown in FIGS. 4A through 4F. The third ferrite layer 23, when shaped so as to cover the coil-shaped conductor layer entirely as shown in FIGS. 4B and 4W, serves also as the fourth ferrite layer 24. In this case, the additional coil-shaped conductor layer is all that is needed to be formed on the already-existing components. Further, just as in the case of FIGS. 4B, 4C, 4E, and 4F, a combination of the parallel-connected coil-shaped conductor layers and the ferrite layer should preferably be made to have substantially a flat upper surface. As shown in FIG. 5H, when a low-magnetic permeability layer is applied over the entire upper surface of the parallel-connected coil-shaped conductor layers, as has been explained previously, it is preferable that the thickness of the low-magnetic permeability layer is adjusted to be substantially the same as that of the coil-shaped conductor layer.

The third and fourth ferrite layers 23 and 24 are far lower in magnetic permeability than the first and second ferrite layers 21 and 22. To be more specific, the magnetic permeability of the third and fourth ferrite layers 23 and 24 falls within a range of from 1 to 10, whereas the magnetic permeability of the first and second ferrite layers 21 and 22 falls within a range of from 100 to 2000. From the standpoint of further stabilization in magnetic flux, the third ferrite layer 23 and the fourth ferrite layer 24 should preferably have the same composition. The lower is the magnetic permeability of the third and fourth ferrite layers 23 and 24, the more likely it is that occurrence of magnetic flux leakage can be suppressed successfully. Therefore, it would be best to set the magnetic permeability of the third and fourth ferrite layers 23 and 24 at 1.

Figure 6:
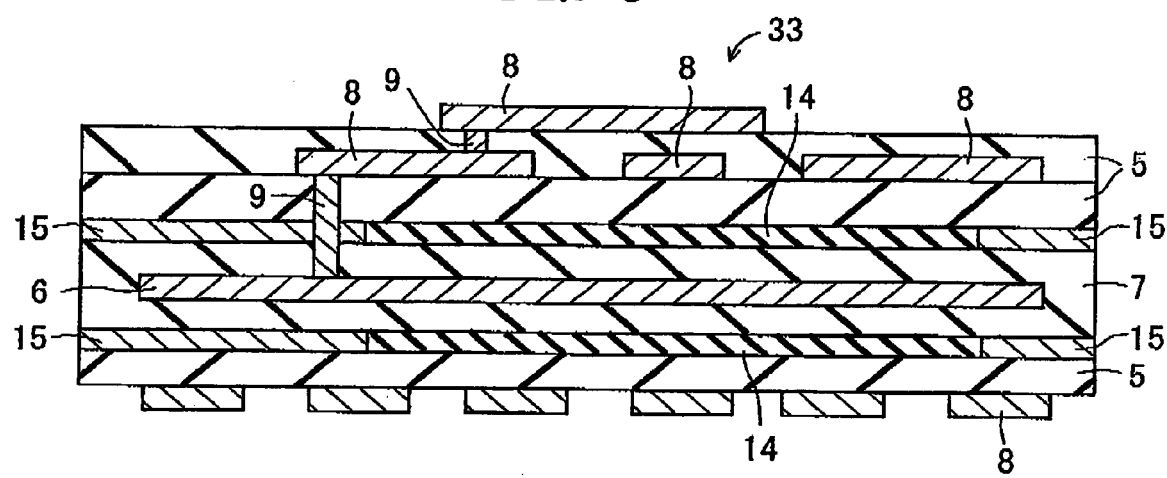
FIG. 6 is a sectional view schematically showing the constitution of the ceramic substrate in accordance with still another embodiment of the invention, the ceramic layer of which is made of glass ceramic.

FIG. 6 is a sectional view schematically showing the constitution of a ceramic substrate 33 implemented by way of still another embodiment of the invention. The ceramic substrate 33 has its ceramic layer 5 made of glass ceramic. The ceramic substrate 33 differs from the ceramic substrate 1 that has already been explained with reference to FIGS. 2 and 3 in that the ceramic layer 5 is made of glass ceramic and in that an intermediary layer is interposed between the ceramic layer 5 and the ferrite layer 7. As the intermediary layer, an electrically insulating layer 14 and a sintered metal layer 15 are used. Note that, in FIG. 6, the constituent components that play the same or corresponding roles as in FIGS. 1 to 3 will be identified with the same reference designations, and overlapping descriptions will be omitted.

In FIG. 6, the glass ceramic-made ceramic layer 5 is formed as follows. At first glass powder, filler powder (ceramic powder), an organic binder, a plasticizer, an organic solvent, and the like are blended together to form a slurry. The slurry is then formed into glass ceramic green sheets by means of doctor blade method, rolling method, calender rolling method, or otherwise in preparation for forming the ceramic layers 5. Then, a plurality of the glass ceramic green sheets are stacked together so as to sandwich therebetween the ferrite layer 7.

The specific examples of the glass powder for use include: $SiO_2$—$B_2O_3$ base powder; $SiO_2$—$B_2O_3$—$Al_2O_3$ base powder; $SiO_2$—$B_2O_3$—$Al_2O_3$-MO base powder (M represents Ca, Sr, Mg, Ba, or Zn); $SiO_2$—$Al_2O_3$-$M^1$O-$M^2$O base powder ($M^1$ and $M^2$ are either equal or unequal and indicate Ca, Sr, Mg, Ba, or Zn respectively); $SiO_2$—$B_2O_3$—$Al_2O_3$-$M^1$O-$M^2$O base powder (the conditions for $M^1$ and $M^2$ are the same as above); $SiO_2$—$B_2O_3$-$M^3_2$O base powder ($M^3$ represents Li, Na, or K); $SiO_2$—$B_2O_3$—$Al_2O_3$—$M^3_2$O base powder (the condition for $M^3$ is the same as above); Pb base glass powder; and Bi base glass powder.

The specific examples of the filler powder for use include: compound oxide of $Al_2O_3$, $SiO_2$, $ZrO_2$, and alkaline earth metal oxide; compound oxide of $TiO_2$ and alkaline earth metal oxide; and compound oxide which contains at least one of $Al_2O_3$ and $SiO_2$ (spinel, mullite, or cordierite, for instance).

The electrically insulating layer 14 acting as the intermediary layer is interposed between the ferrite layer 7 and the ceramic layer 5. For example, glass powder and the same ferrite powder as that contained in the ferrite layer 7 are blended together in a manner such that the thermal expansion coefficient of the resultant admixture falls in between the thermal expansion coefficient of the ceramic layer 5 and that of the ferrite layer 7. Then, the admixture is kneaded with suitable organic binder and solvent to form an insulating paste. The insulating paste is print-coated, by means of conventionally known printing technique such as screen printing or gravure printing, on that part of the surface of the glass ceramic green sheet on which the ferrite layer 7 is emplaced. Lastly, the insulating paste and the glass ceramic green sheet carrying it are fired at one time. In so doing there is formed the electrically insulating layer 14.

The ferrite powder used for forming the electrically insulating layer 14 is the same as that used for forming the ferrite layer 7. The major constituent of the powdery ferrite has, as a sintered body, a composition of 63 to 73% by mass of $Fe_2O_3$, 5 to 10% by mass of CuO, 5 to 12% by mass of NiO, and 10 to 23% by mass of ZnO.

Moreover, the glass powder used for forming the electrically insulating layer 14 may be the same as that contained in the glass ceramic constituting the ceramic layer 5. The specific examples thereof include: $SiO_2$—$B_2O_3$ base powder; $SiO_2$—$B_2O_3$—$Al_2O_3$ base powder; $SiO_2$—$B_2O_3$—$Al_2O_3$-MO base powder (M represents Ca, Sr, Mg, Ba, or Zn); $SiO_2$—$Al_2O_3$-$M^1$O-$M^2$O base powder ($M^1$ and $M^2$ are either equal or unequal and indicate Ca, Sr, Mg, Ba, or Zn respectively); $SiO_2$—$B_2O_3$—$Al_2O_3$-$M^1$O-$M^2$O base powder (the conditions for $M^1$ and $M^2$ are the same as above); $SiO_2$—$B_2O_3$-$M^3_2$O base powder ($M^3$ represents Li, Na, or K); $SiO_2$—$B_2O_3$—$Al_2O_3$-$M^3_2$O base powder (the condition for $M^3$ is the same as above); Pb base glass powder; and Bi base glass powder.

The sintered metal layer 15 acting as the intermediary layer is also interposed between the ferrite layer 7 and the ceramic layer 5. For example, glass powder is admixed in at least one kind of powdery metal selected from among Cu, Ag, Au, Pt, Ag—Pd alloy, and Ag—Pt alloy. The resultant admixture is kneaded with suitable organic binder and solvent to form a metal paste. The metal paste is then print-coated, by means of conventionally known printing technique such as screen printing or gravure printing, on that part of the surface of the glass ceramic green sheet on which the ferrite layer 7 is emplaced. Lastly, the metal paste and the glass ceramic green sheet carrying it are fired at one time. In so doing there is formed the sintered metal layer 15.

The glass powder which is contained in the sintered metal layer 15 may be the same as that contained in the glass ceramic constituting the ceramic layer 5. The specific examples thereof include: $SiO_2$—$B_2O_3$ base powder; $SiO_2$—$B_2O_3$—$Al_2O_3$ base powder; $SiO_2$—$B_2O_3$—$Al_2O_3$-MO base powder (M represents Ca, Sr, Mg, Ba, or Zn); $SiO_2$—$Al_2O_3$-$M^1$O-$M^2$O base powder ($M^1$ and $M^2$ are either equal or unequal and indicate Ca, Sr, Mg, Ba, or Zn respectively); $SiO_2$—$B_2O_3$—$Al_2O_3$-$M^1$O-$M^2$O base powder (the conditions for $M^1$ and $M^2$ are the same as above); $SiO_2$—$B_2O_3$-$M^3_2$O base powder ($M^3$ represents Li, Na, or K); $SiO_2$—$B_2O_3$—$Al_2O_3$-$M^3_2$O base powder (the condition for $M^3$ is the same as above); Pb base glass powder; and Bi base glass powder.

Note that the sintered metal layer 15 may be made identical in composition with the wiring pattern layer 8, or part of the wiring pattern layer 8 may be used as the sintered metal layer 15.

Figure 7:
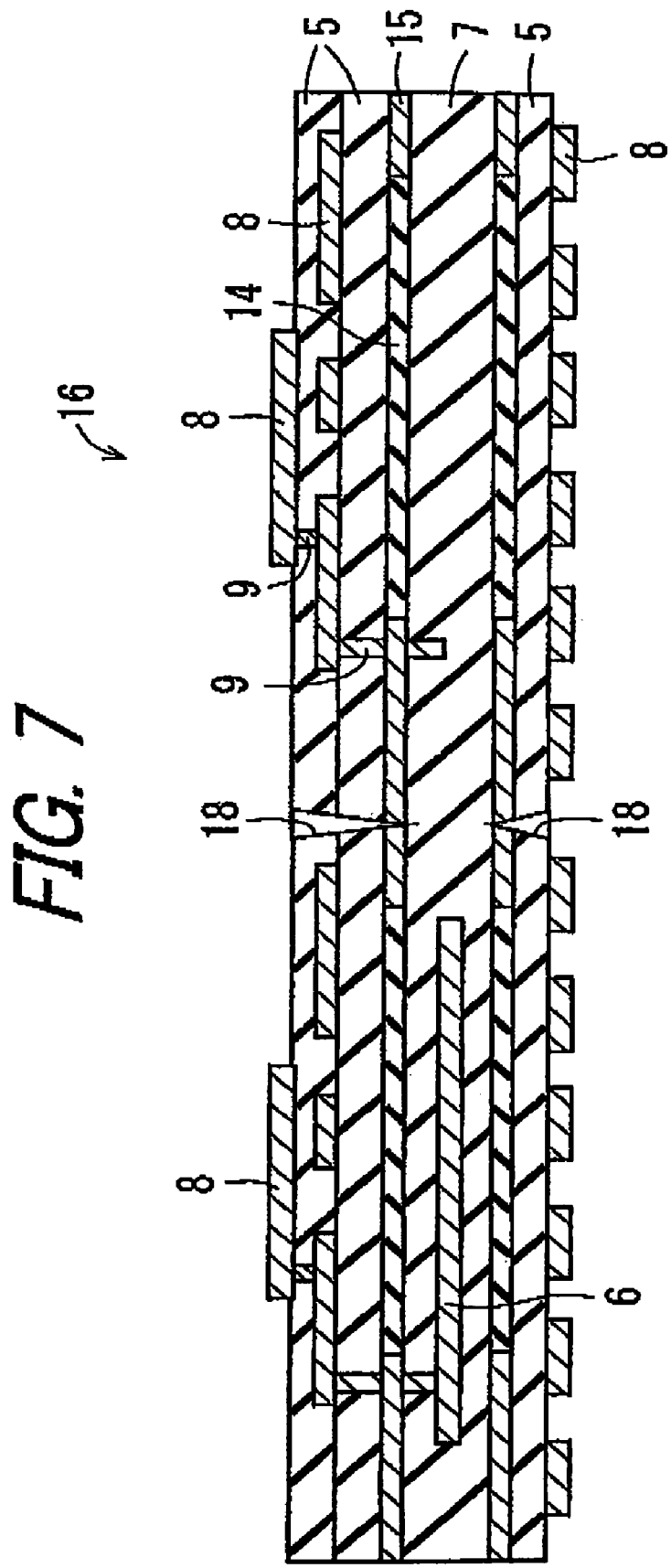
FIG. 7 is a sectional view schematically showing the constitution of a motherboard composed of two ceramic substrates as depicted in FIG. 6 are obtained.

In a case where the intermediary layer is formed of a combination of the electrically insulating layer 14 and the sintered metal layer 15, the intermediary layer may take on various forms. That is, as shown in FIG. 7, the electrically insulating layer 14 and the sintered metal layer 15 may be arranged side by side as one interlayer between the ceramic layer 5 and the ferrite layer 7, or the electrically insulating layer 14 and the sintered metal layer 15 may be stacked together between the ceramic layer 5 and the ferrite layer 7. In another alternative, the intermediary layer may be formed by combining the interlayer configuration and the stack-together configuration as mentioned just above. Irrespective of arrangement, the electrically insulating layer 14 and the sintered metal layer 15 are formed in a manner as described above; that is, the insulating paste and the metal paste are separately print-coated, by means of conventionally known printing technique such as screen printing or gravure printing, on that part of the surface of the glass ceramic green sheet on which the ferrite layer 7 is emplaced. Then, the insulating paste as well as the metal paste and the glass ceramic green sheet carrying it are fired at one time. In so doing there is formed the intermediary layer.

In the case of interposing between the ceramic layer 5 and the ferrite layer 7 the intermediary layer composed of the electrically insulating layer 14 and the sintered metal layer 15 of interlayer configuration, it is possible to create the wiring pattern layer 3 by using the electrically insulating layer 14 and the sintered metal layer 15 acting as an insulator and a conductor, respectively. Moreover, in the case of interposing between the ceramic layer 5 and the ferrite layer 7 the intermediary layer composed of the electrically insulating layer 14 and the sintered metal layer 15 of stack-together configuration, it is possible to enhance the stress alleviation effect brought about by the electrically insulating layer 14 and the sintered metal layer 15 even further. Further, in the case of interposing between the ceramic layer 5 and the ferrite layer 7 the intermediary layer formed by combining the interlayer configuration and the stack-together configuration, it is possible to attain the synergistic effect of the two arrangements.

At this time, it is desirable to ensure that the upper and lower surfaces of the wiring pattern layer 8 are covered completely by the ferrite layer 7 from the viewpoint of increasing the inductance of the coil-shaped conductor layer in an effective manner. In order to achieve this, on the surface of a predetermined glass ceramic green sheet are successively laminated a ferrite green sheet to be formed into the lower ferrite layer 7, a pattern of a conductor paste to be formed into the wiring pattern layer 8, and a ferrite green sheet to be formed into the upper ferrite layer 7 in the order named.

Figure 8:
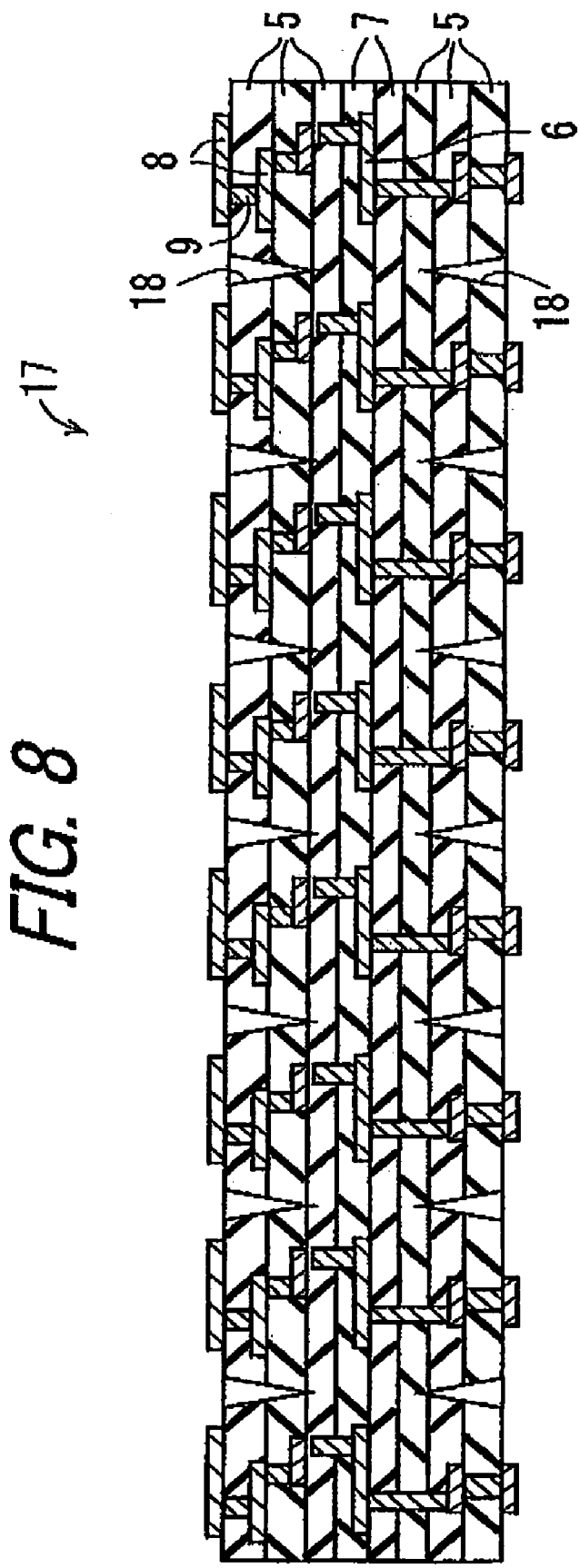
FIG. 8 is a sectional view schematically showing the constitution of a multiple-dividable motherboard composed of a plurality of ceramic substrates.

FIGS. 7 and 8 are sectional views schematically showing a so-called multiple-dividable motherboard used to fabricate the ceramic substrate 33 shown in FIG. 6. A plurality of ceramic substrates 1 can be obtained concurrently and collectively out of a single wide-area motherboard 16. The substantially flat-shaped motherboard 16 is designed to have, at least on one of its upper and lower main surfaces, division grooves 18 formed so as to extend longitudinally and transversely, so that the motherboard 16 can be divided into a plurality of ceramic substrates 1. The motherboard 16 is fractured along the division grooves 18 into a plurality of the ceramic substrates 33. Note that, in FIGS. 7 and 8, the constituent components that play the same or corresponding roles as in FIGS. 2, 3, and 6 will be identified with the same reference designations, and overlapping descriptions will be omitted.

The division groove 18 is formed along a divisional line of the motherboard 16 in such a depth as to reach the ferrite layer 7. If the ferrite layer 7 is not reached by the division groove 18, since the ceramic layer 5 and the ferrite layer 7 are bound to each other also in the location of the division groove 18, it follows that the ferrite layer 7 is inhibited from shrinking under restraint of the ceramic layer 5. As a consequence, the substrate suffers from roughening due to inadequate sintering in the ferrite layer 7.

For example, the division groove 18 has a front end with V-shaped or U-shaped cross section, although not restricted thereto. The advantage of the division groove 18 of V-shaped profile is that, at the time of dividing the motherboard 16 into pieces, a stress is liable to be concentrated on the division groove, thus causing a fracture readily. This shape is especially desirable if the motherboard 16 has a somewhat large thickness. On the other hand, the advantage of the division groove 18 of U-shaped profile is that the binding action between the ceramic layer S and the ferrite layer 7 in the location of the division groove 18 can be hindered in a wider breadth, wherefore the ferrite layer 7 can be sintered properly without being restrained by the ceramic layer 5 widely. This shape is effective in preventing intrusion of e.g., atmospheric moisture into part of the ferrite layer 7 which is exposed from the side surface of the substrate.

Although there is no particular limitation to a method for creating the division groove 18 so long as it allows digging of an adequate groove in a glass ceramic green sheet stacked body, for example, the division groove 18 may be formed by means of press working or by using a moving blade.

Meanwhile, in the ceramic substrate 1 thus far described, the ferrite layer 7 is preferably so designed that its midportion is higher than its outer peripheral portion in the percentage of void content (void ratio) Specifically, the void ratio of the outer peripheral portion is adjusted to fall in a range of from 0 to 5%, whereas the void ratio of the midportion is adjusted to fall in a range of from 5 to 15%. If the void ratio of the outer peripheral portion is greater than 5%, for example, atmospheric moisture may find its way into the glass ceramic substrate through this portion, and eventually the glass ceramic substrate becomes water-absorptive. If the void ratio of the midportion is less than 5%, the difference in void ratio between the midportion and the outer peripheral portion and correspondingly the difference in magnetic permeability therebetween are so small that occurrence of magnetic flux leakage cannot be suppressed effectively. Moreover, if the void ratio of the midportion exceeds 15%, there is the possibility of insufficiency in the mechanical strength of the substrate per se. It is thus desirable to set the void ratio of the midportion at or below 15%.

In order to make void ratio measurement, at first, the ceramic layer 5 is subjected to mirror polishing with use of a flat-surface grinding machine. Then, the cross section of the ferrite layer 7 is photographed by a scanning electron microscope at a magnification in a range of from 1000 to 5000. The photograph thus taken is subjected to binary image processing to differentiate a ferrite part and a void part. On the basis of the binary data, a surface area ratio is figured out.

The multiple-dividable motherboard is constructed as follows. At first a plurality of glass ceramic green sheets and a ferrite green sheet with a conductor paste print-coated thereon are stacked together to form a glass ceramic green sheet stacked body. Next, the division grooves 18 are created on the glass ceramic green sheet stacked body. Following the removal of organic substances contained therein, the glass ceramic green sheet stacked body is subjected to firing. In order to remove organic substances, the glass ceramic green sheet stacked body is heated at a temperature in a range of from 100 to 800° C. under a predetermined load until organic substances are decomposed and volatilized. Usually the glass ceramic green sheet stacked body is fired at a temperature in a range of from 800 to 1000° C., although the firing temperature varies depending on the composition of glass ceramic contained therein. The firing is carried out in an air atmosphere under normal circumstances. Exceptionally, in a case where the wiring pattern layer 8 is formed of a Cu-made conductor material, the removal of organic substances is carried out in a humid nitrogen atmosphere at a temperature in a range of from 100 to 700° C., followed by performing firing in a nitrogen atmosphere.

At the time of performing the removal of organic substances as well as firing, preferably, in order to prevent occurrence of warpage, an adequate load is placed on the glass ceramic green sheet stacked body by putting a weight onto its upper surface or otherwise. The appropriate range of the load extends from 50 Pa to 1 MPa. If the load is less than 50 Pa, occurrence of warpage cannot be prevented in the glass ceramic green sheet stacked body without fail. On the other hand, if the load is greater than 1 MPa, it is necessary to use so large a weight that the glass ceramic green sheet stacked body with the weight placed thereon cannot be taken in a firing furnace, or, granted that it can be laid in the firing furnace, the weight is so large that heat capacity becomes insufficient, which gives rise to improper firing or the like problem.

In order to avoid variations in load resulting from deformation or melting of a weight on the glass ceramic green sheet stacked body that occurs during firing, or to allow the decomposed organic substances to be volatilized without fail, it is desirable to use a heat-resistant weight having a porous structure. To be specific, a weight made of a fireproof material such as ceramic or a metal material having a high melting point is usable. It is also possible to use two weights of different types: a porous weight and a non-porous weight. In this case, on the upper surface of the glass ceramic green sheet stacked body are placed successively the porous weight and the non-porous weight in this order.

Hereinafter, the invention will be explained concretely by way of actual Examples and comparative examples. At first, analysis was conducted for the desired composition of ferrite materials.

EXAMPLE 1

Raw materials of varying composition as given in Table 1 were adjusted to weigh 250 g on an individual basis. The constituents of the raw material have been blended with a liter of pure water for 24 hours in a 2-liter ball mill constructed of a zirconia pulverization ball. Following a fractional drying process, the raw material powder was fired tentatively in a zirconia crucible at a temperature of 730° C. After it has been determined that there is obtained a desired compound by means of X-ray diffraction, the raw material was pulverized into small particles by a ball mill and dried. The powder particles were sifted out through a mesh sieve to obtain tentatively-fired powder having a particle size of 0.5 to 0.7 μm. Subsequently, the powder was granulated by a stone mill, with a 10% by mass of PVA solution added. The granulated powder thus obtained was subjected to stamping with a die and fired in an air atmosphere at a temperature of 900° C. for two hours. In so doing there was fabricated a sintered toroidal test sample having an outer diameter of 16 mm, an inner diameter of 8 mm, and a thickness of 2 mm.

Figure 9:
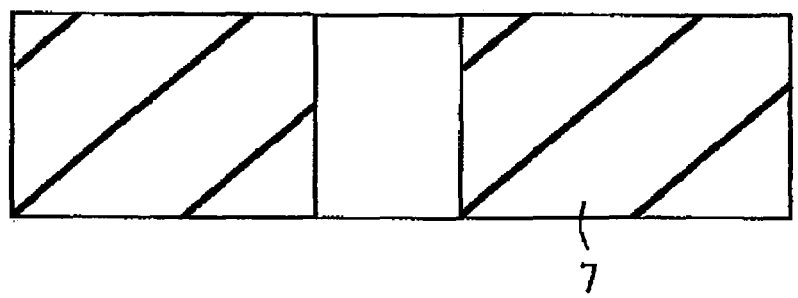
FIG. 9 is a sectional view of a sintered toroidal test sample for use in sintered density measurement as well as in magnetic permeability measurement.

FIG. 9 is a sectional view of the sintered toroidal test sample for use in sintered density measurement as well as in magnetic permeability measurement.

The density of the test sample was measured by means of in-liquid weighing method, whereas the magnetic permeability thereof was measured by using Impedance analyzer (Type HP-4291A: manufactured by Hewlett-Packard Development Company. L. P.) under the conditions of 1.0 MHz and 10 MHz.

TABLE 1

| Sample No. | Composition (weight %) | | | | Magnetic permeability (1 MHz) | Magnetic permeability (10 MHz) | Density (g/cm³) | Memo |
|---|---|---|---|---|---|---|---|---|
| | $Fe_2O_3$ | ZnO | NiO | CuO | | | | |
| 1 | 70.0 | 18.0 | 6.0 | 6.0 | 500 | 400 | 5.2 | Invention |
| 2 | 70.0 | 11.0 | 11.0 | 7.0 | 120 | 120 | 5.1 | Invention |
| 3 | 66.0 | 17.0 | 10.0 | 7.0 | 350 | 340 | 5.2 | Invention |
| 4 | 63.0 | 15.0 | 15.0 | 7.0 | 240 | 240 | 5.1 | Invention |
| 5 | 73.0 | 11.0 | 9.0 | 7.0 | 150 | 150 | 5.1 | Invention |
| 6 | 71.0 | 10.0 | 11.0 | 8.0 | 100 | 100 | 5.1 | Invention |
| 7 | 65.0 | 23.0 | 6.0 | 6.0 | 700 | 500 | 5.2 | Invention |
| 8 | 70.0 | 18.0 | 5.0 | 7.0 | 550 | 430 | 5.2 | Invention |
| 9 | 68.0 | 13.0 | 12.0 | 7.0 | 250 | 250 | 5.1 | Invention |
| 10 | 69.0 | 18.0 | 8.0 | 5.0 | 450 | 430 | 5.2 | Invention |
| 11 | 70.0 | 13.0 | 7.0 | 10.0 | 200 | 200 | 5.2 | Invention |
| 12 | *62.0 | 16.0 | 15.0 | 7.0 | 90 | 90 | 5.1 | Comparative example |
| 13 | *74.0 | 11.0 | 8.0 | 7.0 | 140 | 140 | 4.8 | Comparative example |
| 14 | 71.0 | *9.0 | 12.0 | 8.0 | 70 | 70 | 5.0 | Comparative example |
| 15 | 64.0 | *24.0 | 6.0 | 6.0 | 300 | 80 | 5.1 | Comparative example |
| 16 | 70.0 | 18.0 | *4.0 | 8.0 | 400 | 90 | 5.1 | Comparative example |
| 17 | 68.0 | 12.0 | *13.0 | 7.0 | 90 | 90 | 5.0 | Comparative example |
| 18 | 70.0 | 18.0 | 8.0 | *4.0 | 300 | 230 | 4.6 | Comparative example |
| 19 | 70.0 | 13.0 | 6.0 | *11.0 | 80 | 80 | 5.1 | Comparative example |

Values marked with an asterisk (*) signify departures from the scope of the invention.

Also listed in Table 1 are the results of sintered density measurement and magnetic permeability measurement. As will be understood from the table, test samples made of a material whose major constituent has a composition coming within the compositional limits specified according to the invention are each excellent in sintered density and magnetic permeability.

More specifically, as will be understood from Table 1, any of the test samples embodying the invention fulfills the necessary conditions for the target ferrite characteristics: a sintered density of 5 g/cm$^3$ or above and magnetic permeability of 100 or above as observed at 1.0 MHz and 10.0 MHz.

Next, analysis was conducted for the advantages of the third ferrite layer 23 shown in FIG. 2 and the fourth ferrite layer 24 shown in FIG. 3.

EXAMPLE 2

To begin with, a non-magnetic ferrite green sheet was formed as follows to form a non-magnetic ferrite layer acting as an insulating layer. At first 630 parts by mass of Fe$_2$O$_3$ powder, 80 parts by mass of CuO powder, and 290 parts by mass of ZnO powder are blended with 4000 cm$^3$ of pure water for 24 hours in a 7000 cm$^3$-ball mill constructed of a zirconia pulverization ball. Following a fractional drying process, the raw material powder is fired tentatively in a zirconia crucible at a temperature of 730° C. In do doing there is prepared tentatively-fired non-magnetic ferrite powder. Subsequently, 10% by mass of butyral resin and, as a diluent, 45% by mass of alcohol of high molecular weight are added with respect to 100% by mass of the tentatively-fired non-magnetic ferrite powder thus obtained. They are blended together by a ball mill technique to form a slurry. The slurry is then formed into a 100 μm-thick non-magnetic ferrite green sheet by the doctor blade method.

The non-magnetic ferrite green sheet thus obtained was subjected to stamping with a die to create a 150 μm-diameter through hole in which was charged a through conductor paste by the screen printing technique. The coating has been dried for 30 minutes at a temperature of 70° C., thereby forming a through conductor compound which is formed into a through conductor. In order to prepare the through conductor paste, 10 parts by mass of glass powder acting as a sintering aid, 12 parts by mass of acrylic resin, and 2 parts by mass of α-terpineol acting as an organic solvent are added with respect to 100 parts by mass of Ag powder. They are blended thoroughly by an agitating/defoaming machine and then kneaded thoroughly by a three-roll mill.

Next, a wiring conductor paste was applied to the non-magnetic ferrite green sheet in a thickness of 20 μm by the screen printing technique. The coating has been dried for 30 minutes at a temperature of 70° C., thereby forming an outer wiring conductor pattern and an inner wiring conductor pattern that are formed into an outer wiring conductor and an inner wiring conductor, respectively. In order to prepare the outer wiring conductor paste, 12 parts by mass of acrylic resin and 2 parts by mass of α-terpineol acting as an organic solvent are added with respect to 100 parts by mass of Ag powder. They are blended thoroughly by an agitating/defoaming machine and then kneaded thoroughly by a three-roll mill.

Secondly, ferrite green sheets were formed as follows to form the first ferrite layer and the second ferrite layer. With use of a raw material having the same composition as test sample numbered 1 as given in Table 1, ferrite powder is prepared basically in the same manner as that for preparing the tentatively-fired non-magnetic ferrite powder. After that, 10% by mass of butyral resin and, as a diluent, 45% by mass of alcohol of high molecular weight are added with respect to 100% by mass of the tentatively-fired ferrite powder. They are blended together by a ball mill technique to form a slurry. The slurry is then formed into 100 μm-thick ferrite green sheets by the doctor blade method.

The ferrite green sheet thus obtained was subjected to stamping with a die to create a 150 μm-diameter through hole in which was charged a through conductor paste by the screen printing technique. The coating has been dried for 30 minutes at a temperature of 70° C., thereby forming a through conductor compound which is formed into a through conductor. In order to prepare the through conductor paste, 10 parts by mass of glass powder acting as a sintering aid, 12 parts by mass of acrylic resin, and 2 parts by mass of α-terpineol acting as an organic solvent are added with respect to 100 parts by mass of Ag powder. They are blended thoroughly by an agitating/defoaming machine and then kneaded thoroughly by a three-roll mill.

Next, an inner wiring conductor paste was applied to the ferrite green sheet in a thickness of 30 μm by the screen printing technique. The coating has been dried for 30 minutes at a temperature of 70° C., thereby forming an inner wiring conductor pattern which is formed into a planar spiral coil. In order to prepare the inner wiring conductor paste, 10 parts by mass of acrylic resin and 1 part by mass of α-terpineol acting as an organic solvent are added with respect to 100 parts by mass of Ag powder. They are blended thoroughly by an agitating/defoaming machine and then kneaded thoroughly by a three-roll mill.

After that, a non-magnetic ferrite paste was applied to the ferrite green sheet in a thickness of 30 μm so as to cover the entire upper surface of the planar spiral coil by the screen printing technique. The coating has been dried for 30 minutes at a temperature of 70° C., thereby forming the third ferrite layer. In order to prepare the non-magnetic ferrite paste, at first, basically in the same manner as that for forming the non-magnetic ferrite green sheet, tentatively-fired non-magnetic ferrite powder is prepared. Then, 15 parts by mass of acrylic resin and 3 parts by mass of α-terpineol acting as an organic solvent are added with respect to 100% by mass of the tentatively-fired non-magnetic ferrite powder. They are blended thoroughly by an agitating/defoaming machine and then kneaded thoroughly by a three-roll mill.

Next, the ferrite green sheet and the non-magnetic ferrite green sheet were stacked together, and the stack was subjected to thermal compression bonding at a temperature of 50° C. and under a pressure of 5 MPa, thereby forming a green sheet stacked body.

Lastly, the stacked body has been fired at 500° C. for 3 hours in an air atmosphere to remove organic substances contained therein, and then fired at 900° C. for 1 hour in an air atmosphere. In so doing there was formed a ceramic substrate.

Measurement was made of the DC resistance and superposition characteristics of the ceramic substrate implemented by way of Example 2. The superposition characteristics were measured by means of current-voltage method with use of Impedance analyzer (Type HP-4194A: manufactured by Hewlett-Packard Development Company. L. P.). The DC resistance was measured by means of 4-terminal method with use of Digital multi-meter (Type R-6561: manufactured by ADVANTEST Corporation). The results of DC resistance measurement and superposition characteristics measurement are given in Table 2.

COMPARATIVE EXAMPLE 1

A test sample was fabricated by way of Comparative example 1 to make evaluations. Comparative example 1 is formed basically in the same manner as in Example 2, the only difference being that no third ferrite layer 23 is formed. Measurement was made of the DC resistance and superposition characteristics of the glass ceramic substrate of Comparative example 1. The measurement results are given in Table 2.

EXAMPLE 3

A ceramic substrate was fabricated by way of Example 3 basically in the same manner as in Example 2, the only difference being that electromagnetic shielding layers are interposed between the first ferrite layer and one insulating layer and between the second ferrite layer and the other insulating layer, respectively, face to face with the planar spiral coil. The electromagnetic shielding layers were formed as follows. At first 12 parts by mass of acrylic resin and 2 parts by mass of α-terpineol acting as an organic solvent are added with respect to 100 parts by mass of Ag powder. They are blended thoroughly by an agitating/defoaming machine and then kneaded thoroughly by a three-roll mill to form a conductor paste. The conductor paste is applied to the predetermined regions in a thickness of 20 μm by the screen printing technique, the area of which is one-half that of the planar spiral coil. Lastly, the coating is dried for 30 minutes at a temperature of 70° C. Measurement was made of the DC resistance and superposition characteristics of the ceramic substrate of Example 3. The measurement results are given in Table 2.

EXAMPLE 4

A ceramic substrate was fabricated by way of Example 4 basically in the same manner as in Example 3, the only difference being that the electromagnetic shielding layer is so shaped as to cover the planar spiral coil entirely. Measurement was made of the DC resistance and superposition characteristics of the ceramic substrate of Example 4. The measurement results are given in Table 2.

EXAMPLE 5

A ceramic substrate was fabricated by way of Example 5 basically in the same manner as in Example 4, the only difference being that two parallel-connected planar spiral coils are arranged in a face-to-face manner in a thickness-wise direction. Note that the ferrite green sheet in which is formed the upper planar spiral coil is made 200 μm in thickness. Measurement was made of the DC resistance and superposition characteristics of the ceramic substrate of Example 5. The measurement results are given in Table 2.

EXAMPLE 6

A ceramic substrate was fabricated by way of Example 6 basically in the same manner as in Example 5, the only difference being that non-magnetic ferrite is interposed between the planar spiral coil conductors arranged in a face-to-face manner in the thickness-wise direction. Note that the ferrite green sheet in which is formed the upper planar spiral coil exhibits no magnetic property. Measurement was made of the DC resistance and superposition characteristics of the ceramic substrate of Example 6. The measurement results are given in Table 2.

EXAMPLE 7

A ceramic substrate was fabricated by way of Example 7 basically in the same manner as in Example 6, the only difference being that the interval between the planar spiral coil conductors arranged in a face-to-face manner in the thickness-wise direction is set at 100 μm. Note that the non-magnetic ferrite green sheet in which is formed the upper planar spiral coil is made 100 μm in thickness. Measurement was made of the DC resistance and superposition characteristics of the ceramic substrate of Example 7. The measurement results are given in Table 2.

TABLE 2

|  | Superposition characteristics | Conductor resistance |
| --- | --- | --- |
| Example 2 | B | 700 mΩ |
| Example 3 | A | 700 mΩ |
| Example 4 | AA | 700 mΩ |
| Example 5 | B | 350 mΩ |
| Example 6 | A | 350 mΩ |
| Example 7 | AA | 350 mΩ |
| Comparative example 1 | D | 700 mΩ |

In Table 2, the test samples are rated in superposition characteristics on a D to AA scale (AA being best). An "AA"-rated sample satisfies an inductance standard of 2 μH at 600 mA; an "A"-rated sample satisfies the inductance standard of 2 μH at 500 mA; a "B"-rated sample satisfies the inductance standard of 2 μH at 300 mA; a "C"-rated sample satisfies the inductance standard of 2 μH at 100 mA; and a "D"-rated sample does not satisfy the inductance standard at all. In general, a coiled conductor is able to function satisfactorily when mounted in a cellular telephone so long as it is designed to have an inductance value of 2 μH or above at 300 mA or above.

As shown in Table 2, it has been confirmed that Example 2, which has such a structure that between the planar spiral coil-shaped conductor layer portions is interposed the third ferrite layer 23 which is lower in magnetic permeability than the first and second ferrite layers, offers excellent superposition characteristics in contrast to Comparative example 1.

It has also been confirmed that Example 3 having the electromagnetic shielding layer is superior to Example 2 in point of superposition characteristics. This is because, in Example 3, magnetic lines of force can be inhibited from leaking to the exterior of the construction with reliability, wherefore stabilization in magnetic lines of force can be achieved.

Moreover, it has been confirmed that Example 4 having the electromagnetic shielding layer shaped so as to entirely cover the coil-shaped conductor layer is superior to Example 3 in point of superposition characteristics. This is because, in Example 4, magnetic lines of force can be inhibited from leaking to the exterior of the construction more reliably, wherefore stabilization in magnetic lines of force can be achieved.

Further, it has been confirmed that, in Example 5 in which two identically shaped, parallel-connected planar spiral coils are arranged in a face-to-face manner in the thickness-wise direction, its conductor resistance is one-half that of Example 2, but its conductor cross-sectional area is twice as large as that of Example 2.

Still further, it has been confirmed that Example 6 in which non-magnetic ferrite is interposed between the planar spiral coil conductors is superior to Example 5 in point of superposition characteristics. This is because, in Example 6, magnetic flux leakage occurring between the planar spiral coil conductors can be suppressed with reliability.

Yet further, it has been confirmed that Example 7 in which the interval between the planar spiral coil conductors is set at 100 μm is superior to Example 6 in point of superposition characteristics. This is because, in Example 7, magnetic flux leakage occurring between the planar spiral coil conductors can be suppressed more reliably by narrowing the interval between the planar spiral coil conductors.

Next, analysis was conducted for the proportion of glass powder contained in the non-magnetic ferrite layer.

EXAMPLE 8

Figure 10:
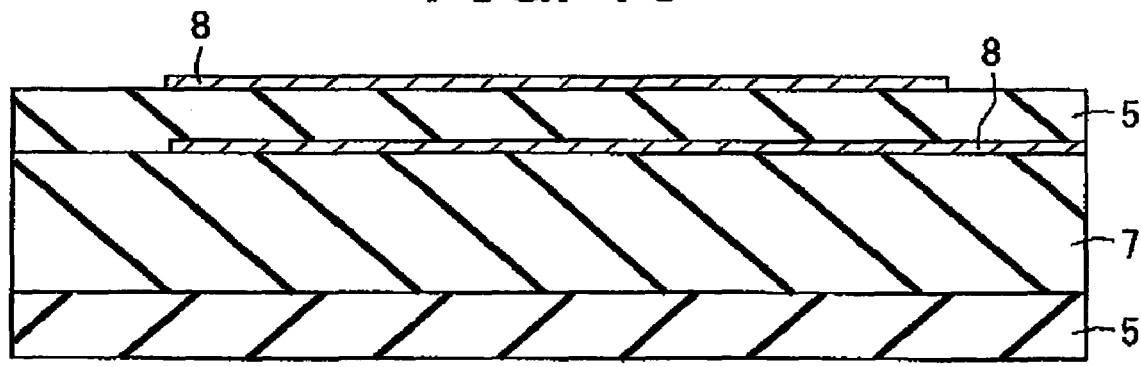
FIG. 10 is a sectional view of a test sample fabricated for use in insulation resistance measurement for a non-magnetic ferrite layer.

FIG. 10 is a sectional view of a test sample fabricated for use in insulation resistance measurement for the non-magnetic ferrite layer 5. In FIG. 10, the constituent components that play the same or corresponding roles as in FIG. 2 will be identified with the same reference designations. In this construction, as shown in FIG. 10, the magnetic ferrite layer 7 is sandwiched between a pair of non-magnetic ferrite layers 5. Moreover, the wiring pattern layer 8 is formed on both sides of one of the non-magnetic ferrite layers 5. Test samples having such a structure were fabricated in accordance with the following procedure.

At first, the tentatively-fired non-magnetic ferrite powder as prepared in Example 2 and $SiO_2$—CaO—MgO base glass powder having a volume resistivity value of $1 \times 10^{11}$ Ωm are blended together according to the compositional ratio given in Table 3 to form admixture powder of varying composition. Subsequently, 10% by mass of butyral resin and, as a diluent, 45% by mass of alcohol of high molecular weight are added with respect to 100% by mass of the admixture powder. They are blended together by a ball mill technique to form a slurry. The slurry is then formed into a 100 μm-thick non-magnetic ferrite green sheet by the doctor blade method.

After that, the wiring conductor paste as prepared in Example 2 is applied to both sides of the non-magnetic ferrite green sheet in a thickness of 20 μm by the screen printing technique to form 30 mm-dia circular patterns with a lead wire extending endwise. The coating is dried for 30 minutes at a temperature of 70° C., thereby forming conductor patterns for use in insulation resistance measurement.

After that, the non-magnetic ferrite green sheet thus molded and the ferrite green sheet as formed in Example 2 are stacked together, and the stack is subjected to thermal compression bonding at a temperature of 50° C. and under a pressure of 5 MPa, thereby forming a green sheet stacked body.

Next, the stacked body is fired at 500° C. for 3 hours in an air atmosphere to remove organic substances contained therein, and then fired at 900° C. for 1 hour in an air atmosphere. In so doing there were formed test samples for use in insulation resistance measurement.

Measurement was made of the water absorption percentage and insulation resistance of the test samples of Example 8. Water absorption measurement was carried out as follows. Following weight calculation, the test sample is immersed in water, and the wet test sample is left alone for an hour in a vacuum. After that, the test sample is weighed once again to obtain a weight variation. Note that the weight calculation was made with use of Electronic balance (Type AUX 120: manufactured by SHIMADU Corporation). The weight difference is divided by the initial weight of the test sample and the calculated value is expressed on a percentage basis. The measurement results are given in Table 3. In Table 3, a sample exhibiting water absorption of 0.1% or above is rated "B" as being absorptive, whereas a sample exhibiting water absorption of less than 0.1% is rated "A" as being non-absorptive. Volume resistivity value measurement was effected with use of DEGITAL SUPER MEGOHM METER (Type DSM 8103: manufactured by TOA Electronics. Ltd). The volume resistivity value of the sample was determined by calculating a value of resistance between the insulating layers with consideration given to the shape of the insulating layer. Listed in Table 3 are the results of water absorption measurement and volume resistivity value measurement performed on the test samples of Example 8.

TABLE 3

| Composition (mass %) | | Volume resistivity | |
|---|---|---|---|
| Non-magnetic ferrite | Glass | value (mΩ) | Water absorption |
| 99 | 1 | $0.9 \times 10^{10}$ | A |
| 97 | 3 | $1.1 \times 10^{10}$ | A |
| 91 | 9 | $3.0 \times 10^{10}$ | A |
| 85 | 15 | $12.0 \times 10^{10}$ | A |
| 83 | 17 | $10.0 \times 10^{10}$ | B |

As will be understood from Table 3, test samples having the ceramic layer 5 whose composition comes within the compositional limits specified according to the invention are each excellent in volume resistivity value ($1 \times 10^{10}$ Ωm or above), water absorption, and sinterability.

Next, analysis was conducted for the proportion of Ag and divalent metal oxide added to the metallized wiring layer.

EXAMPLE 9

At first a conductor pattern for use in metallization strength measurement was formed as follows. An outer wiring conductor paste such as that which is used in Example 2 is applied to a non-magnetic ferrite sheet formed basically in the same manner as in Example 2 in a size of 2 square millimeters and in a thickness of 20 μm by the screen printing technique. The coating is dried for 30 minutes at a temperature of 70° C. Moreover, in order to carry out measurement of the inductance and sheet resistance of the outer wiring conductor, a linear independent pattern which is 150 μm in width and 20 mm in length was formed by the screen printing technique. Next, the non-magnetic ferrite sheets were stacked together, and the stack was subjected to thermal compression bonding at a temperature of 50° C. and under a pressure of 5 MPa, thereby forming a green sheet stacked body. Lastly, the stacked body was fired at 500° C. for 3 hours in an air atmosphere to remove organic substances contained therein, and then fired at 900° C. for 1 hour in an air atmosphere. In so doing there were formed experimental substrates for use in measurement of metallization strength, sheet resistance, and inductance.

EXAMPLES 10 THROUGH 23

As Examples 10 through 23, experimental substrates for use in measurement of metallization strength, sheet resistance, and inductance were fabricated basically in the same manner as in Example 9, the only difference being the composition of the outer wiring conductor paste for use, as shown in Table 4.

EXAMPLE 24

As Example 24, experimental substrates for use in measurement of metallization strength and sheet resistance were fabricated basically in the same manner as in Example 9, the only difference being that NiO is added to the outer wiring conductor paste as divalent metal oxide.

EXAMPLE 25

As Example 25, experimental substrates for use in measurement of metallization strength, sheet resistance, and inductance were fabricated basically in the same manner as in Example 9, the only difference being that the metallization-strength measurement pattern as well as the sheet-resistance and inductance measurement independent linear pattern is so designed that its outer periphery is made 25 μm in width by using an outer wiring conductor paste having a composition as shown in Table 4.

Next, measurement was made of the metallization strength of the outer wiring conductor as follows in each of Examples 9 through 25 on an individual basis. On the metallization-strength measurement pattern is placed a 2 mm-diameter, 10 mm-height Cu-made pin. The pattern and the pin are bonded to each other with use of eutectic solder and heated at 245° C. Subsequently, with use of Push-pull gage (Model 1310 DW: manufactured by AIKO ENGINEERING Co., Ltd), the test piece is subjected to a pulling force developed by pulling on the pin at a pulling speed of 100 mm/min. The results of metallization strength measurement are given in Table 4.

Moreover, measurement was made of the inductance of the inductance measurement pattern portion in each of Examples 9 through 25 on an individual basis. The inductance measurement was conducted under an applied voltage of 0.5V with use of Impedance analyzer (Type 4194A: manufactured by Agilent technologies. Inc). Listed in Table 4 are the inductance values as observed at a measurement frequency of 1 MHz.

Further, measurement was made of the DC resistance, length, width, and thickness of the sheet-resistance measurement pattern portion in each of Examples 9 through 25 on an individual basis. On the basis of the measurement data, there was calculated a sheet resistance value (mΩ/square) in terms of a pattern thickness of 15 μm. The DC resistance was measured with use of Digital multi-meter (Type R-6871E: manufactured by ADVANTEST Corporation) by bringing its measurement terminal into contact with both ends of the sheet-resistance measurement pattern. The length and width were measured with use of Measure scope (Type MM-22: manufactured by Nikon Corporation). The thickness of the sheet-resistance measurement pattern was measured as follows. At first the test sample is polished in the direction of the cross section thereof. Then, with use of Microscope (Type VH-8000: manufactured by KEYENCE Corporation), the thickness is measured cross-sectionally. The results of sheet resistance measurement are also given in Table 4.

TABLE 4

| Sample No. | Conductor material composition (mass %) | | | | Metallization strength (N) | Sheet resistance (mΩ/square) | Inductance (nH) |
|---|---|---|---|---|---|---|---|
| | Ag | ZnO | CuO | NiO | | | |
| Example 9  | 100.0 |      |      |      | 12 | 1.91 | 1.1 |
| Example 10 | 100.0 |      | 10.0 |      | 45 | 2.17 | 1.1 |
| Example 11 | 100.0 | 10.0 |      |      | 42 | 2.16 | 1.1 |
| Example 12 | 100.0 |      | 5.0  |      | 26 | 1.96 | 1.1 |
| Example 13 | 100.0 |      | 15.0 |      | 46 | 2.46 | 1.1 |
| Example 14 | 100.0 | 5.0  |      |      | 25 | 1.99 | 1.1 |
| Example 15 | 100.0 | 15.0 |      |      | 47 | 2.51 | 1.1 |
| Example 16 | 100.0 | 2.5  | 2.5  |      | 26 | 2.91 | 1.1 |
| Example 17 | 100.0 | 7.5  | 7.5  |      | 40 | 2.55 | 1.1 |
| Example 18 | 100.0 |      | 4.0  |      | 21 | 1.93 | 1.1 |
| Example 19 | 100.0 | 4.0  |      |      | 21 | 1.92 | 1.1 |
| Example 20 | 100.0 |      | 16.0 |      | 46 | 3.03 | 1.1 |
| Example 21 | 100.0 | 16.0 |      |      | 45 | 3.00 | 1.1 |
| Example 22 | 100.0 | 2.0  | 2.0  |      | 20 | 2.03 | 1.1 |
| Example 23 | 100.0 | 8.0  | 8.0  |      | 44 | 3.21 | 1.1 |
| Example 24 | 100.0 |      |      | 10.0 | 42 | 2.20 | 2.4 |
| Example 25 | 100.0 | 5.0  | 5.0  |      | 37 | 2.03 | 1.1 |

As will be understood from Table 4, Examples 10 through 25 employing the outer wiring conductor paste composed of Ag and divalent metal oxide are each higher in metallization strength than Example 9. Among them, Examples 10 to 17, 20, 21, 23, 24, and 25 exhibit remarkably high metallization strength of 25 N or above. These examples employ the outer wiring conductor paste in which the content of divalent metal oxide (CuO, ZnO, or CuO plus ZnO) is adjusted to be 5 parts or above by mass with respect to 100 parts by mass of Ag powder.

Moreover, Examples 10 to 19, 22, 24, and 25 exhibit low sheet resistance of less than 2.6 mΩ/square. These examples employ the outer wiring conductor paste in which the content of divalent metal oxide is 15 parts or below by mass. Examples 20, 21, and 23 employing the outer wiring conductor paste in which the content of divalent metal oxide exceeds 15 parts by mass, although they do not present any problem in practical use, exhibit high sheet resistance of greater than 3.0 mΩ/square.

Further, Examples 10 to 23 and 25 each exhibit an inductance of as low as 1.1 nH. These examples employ the outer wiring conductor paste containing CuO, ZnO, or CuO plus ZnO as divalent metal oxide. By way of contrast, Example 24 employing the outer wiring conductor paste containing NiO as divalent metal oxide, although it does not present any problem in practical use, exhibits an inductance of as high as 2.4 nH.

In addition, Example 25 exhibits low sheet resistance of less than 2.03 mΩ/square. In this example, divalent metal oxide is contained only in the outer periphery of the surface-side metallized wiring layer. By way of contrast, Examples 10 to 12 in which the metallized wiring layers as a whole contain divalent metal oxide, although they do not present any problem in practical use, exhibit an inductance of 2.16 mΩ/square or above.

As will be understood from the foregoing, test samples employing a conductor material whose Ag-divalent metal oxide composition comes within the compositional limits specified according to the invention are each excellent in metallization strength, sheet resistance, and outer conductor's inductance.

Next, analysis was conducted for the effects of disposing the electromagnetic shielding layer 12 as shown in FIG. 3.

EXAMPLE 26

Figure 11:
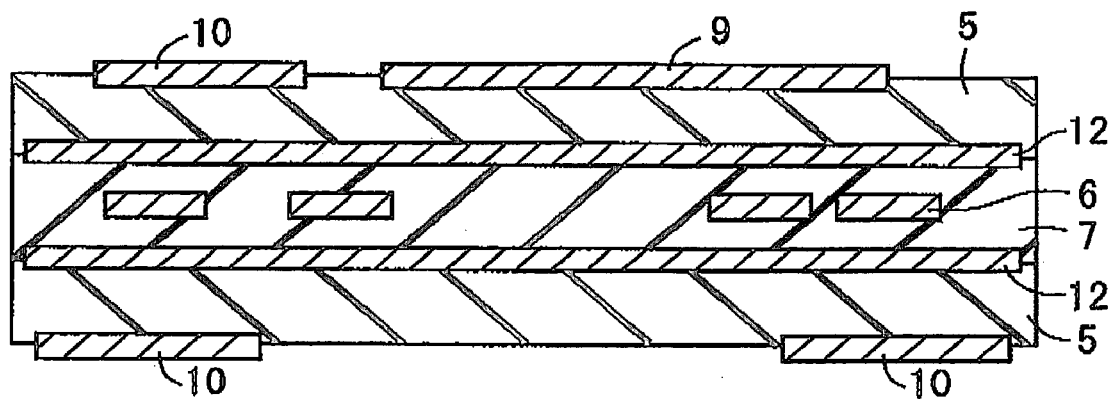
FIG. 11 is a sectional view of a test sample fabricated for the purpose of examining the effects of disposing an electromagnetic shielding layer.

In Example 26, an electromagnetic shielding layer is formed on each of the upper and lower surfaces of a ferrite layer so as to face with a coil-shaped conductor layer. FIG. 11 is a sectional view of a test sample of Example 26 fabricated for the purpose of examining the effects of disposing the electromagnetic shielding layer 12. In FIG. 11, as is the case with FIG. 2, a single coil-shaped conductor layer 6 is formed, and, as is the case with FIG. 3, the electromagnetic shielding layer is interposed between the ferrite layer 7 and the non-magnetic ferrite layer 5. Note that, In FIG. 11, the constituent components that play the same or corresponding roles as in FIGS. 2 and 3 will be identified with the same reference designations.

Specifically, the ceramic layer 5 is formed by laminating two pieces of non-magnetic ferrite layers, each of which is made 50 μm in thickness. The non-magnetic ferrite layers have sandwiched therebetween a ferrite layer having magnetic permeability of 500 (H/m). The ceramic layer 5 and the ferrite layer are fired simultaneously. In the ferrite layer is imbedded an Ag-made coil-shaped conductor layer having a thickness of 30 μm.

In addition, an Ag-made, 10 μm-thick inner electromagnetic shielding layer is formed on each of the upper and lower surfaces of the ferrite layer so as to face with the coil-shaped conductor layer.

The superposition characteristics were measured by means of current-voltage method with use of Impedance analyzer (Type HP-4194A: manufactured by Hewlett-Packard Development Company. L. P.).

Figure 12:
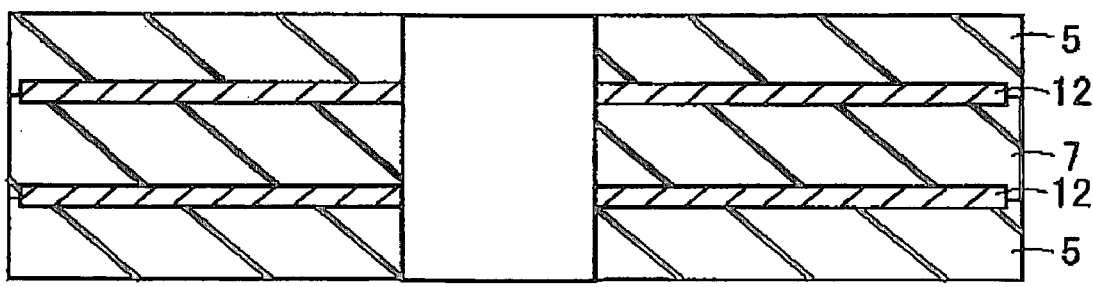
FIG. 12 is a sectional view of a test sample fabricated for use in magnetic permeability measurement for a ferrite layer having the electromagnetic shielding layer.

Moreover, in order to carry out magnetic permeability measurement, a ring-shaped test sample having an outer diameter of 16 mm and an inner diameter of 8 mm was fabricated. FIG. 12 is a sectional view of the test sample with which the magnetic permeability of the ferrite layer 7 provided with the electromagnetic shielding layers 12 was evaluated. In FIG. 12, the non-magnetic ferrite layer 5 and the ferrite layer 7 are stacked together, with the electromagnetic shielding layer 12 lying therebetween. The magnetic permeability was measured by means of high-frequency current-voltage method with use of Impedance analyzer (Type HP-4291A: manufactured by Hewlett-Packard Development Company. L. P.).

EXAMPLE 27

A ceramic substrate was fabricated by way of Example 27 in analogy to Example 26. A point of difference is that the electromagnetic shielding layer is so shaped as to cover the coil-shaped conductor layer entirely. The conditions of measurement and evaluation were the same as in Example 26.

EXAMPLE 28

A ceramic substrate was fabricated by way of Example 28 in analogy to Example 27. A point of difference is that the ferrite layer is made of a material having a composition of 65% by mass of $Fe_2O_3$, 6% by mass of CuO, 6% by mass of NiO, and 23% by mass of ZnO. The conditions of measurement and evaluation were the same as in Examples 26 and 27.

COMPARATIVE EXAMPLES 2 AND 3

Ceramic substrates of conventional design were fabricated by way of Comparative examples 2 and 3 for purposes of comparison with Examples 26 through 28 described hereinbefore. Neither of Comparative examples 2 and 3 is provided with the electromagnetic shielding layer. The conditions of measurement and evaluation were the same as in Examples 26 through 28.

Table 5 shows the results of superposition characteristics evaluation and magnetic permeability evaluation performed on each of Examples 26 through 28 and Comparative examples 2 and 3.

TABLE 5

|  | Superposition characteristics | Magnetic permeability |
| --- | --- | --- |
| Example26 | B | B |
| Example27 | A | B |
| Example28 | A | A |
| Comparative example 2 | D | B |
| Comparative example 3 | D | A |

In Table 5, the ceramic substrates are rated in superposition characteristics on a D to A scale (A being best). An "A"-rated sample satisfies the inductance standard of 2 μH at 500 mA; a "B"-rated sample satisfies the inductance standard of 2 μH at 300 mA; a "C"-rated sample satisfies the inductance standard of 2 μH at 100 mA; and a "D"-rated sample does not satisfy the inductance standard at all. In general, a coiled conductor is able to function satisfactorily when mounted in a cellular telephone so long as it is designed to have an inductance value of 2 μH or above at 300 mA or above.

As shown in Table 5, it has been confirmed that Example 26, which has the electromagnetic shielding layer formed on each of the upper and lower surfaces of the ferrite layer so as to face with the coil-shaped conductor layer, offers excellent superposition characteristics in contrast to Comparative example 2.

It has also been confirmed that Example 27 having the electromagnetic shielding layer shaped so as to entirely cover the coil-shaped conductor layer is superior to Example 26 in point of superposition characteristics. This is because, in Example 27, magnetic lines of force can be inhibited from leaking to the exterior of the construction with reliability, wherefore stabilization in magnetic lines of force can be achieved.

Moreover, it has been confirmed that Example 28 employing the ferrite layer made of a material having the same composition as the test sample numbered 7 of Example 1 is superior to Example 27 in point of magnetic permeability.

By way of contrast, Comparative example 3, although it has the same ferrite layer as Example 28, exhibits poor superposition characteristics in the absence of the electromagnetic shielding layer.

EXAMPLE 29

Raw materials of varying composition were adjusted to weigh 250 g on an individual basis. The constituents of the raw material have been blended with a liter of pure water for 24 hours in a 2-liter ball mill constructed of a zirconia pulverization ball. Following a fractional drying process, the raw material powder was fired tentatively in a zirconia crucible at a temperature of 730° C. After it has been determined that there is obtained a desired compound by means of X-ray diffraction, the raw material was pulverized into small particles by a ball mill and dried. The powder particles were sifted out through a mesh sieve to obtain tentatively-fired powder having a particle size of 0.5 to 0.7 μm. Subsequently, the powder was granulated by a stone mill, with a 10% by weight of PVA solution added. The granulated powder thus obtained was subjected to stamping with a die and fired in an air atmosphere at a temperature of 900° C. for two hours. In so doing there was fabricated a sintered toroidal test sample having an outer diameter of 16 mm, an inner diameter of 8 mm, and a thickness of 2 mm. The density of the test sample was measured by means of in-liquid weighing method, whereas the magnetic permeability thereof was measured by using Impedance analyzer (Type HP-4291A: manufactured by Hewlett-Packard Development Company. L. P.) under the conditions of 1.0 MHz and 10 MHz.

Note that the compositional ratio as to the raw materials used for forming the sintered test samples is given in Table 1. Also listed in Table 1 are the results of sintered density measurement and magnetic permeability measurement performed on the sintered test samples on an individual basis.

As will be understood from Table 1, test samples made of a material whose major constituent has a composition coming within the compositional limits specified according to the invention are each excellent in sintered density and magnetic permeability.

Next, analysis was conducted for the advantage of the division groove 18 as shown in FIGS. 7 and 8.

EXAMPLE 30

As Example 30, a test sample having division grooves of such a depth as to reach the ferrite layer 7 as shown in FIG. 8 was fabricated. After the test sample was divided into pieces, measurement was made of the water absorption percentage of each individual sample piece. Water absorption measurement was carried out as follows. Following weight calculation, the sample piece is immersed in water, and the wet sample piece is left alone for an hour in a vacuum. After that, the sample piece is weighed once again to obtain a weight variation. The weight difference is divided by the initial weight of the sample piece and the calculated value is expressed on a percentage basis. The measurement results are listed in Table 6 which will be given later. In Table 6, a sample piece exhibiting water absorption of 0.1% or above is rated "B", whereas a sample piece exhibiting water absorption of less than 0.1% is rated "A".

The test sample was fabricated as follows. At first there is prepared a glass ceramic compound having a composition of 60% by weight of $SiO_2$—$Al_2O_3$—$MgO$—$B_2O_3$—$ZnO$ base glass powder, 20% by weight of $CaZrO_3$ powder, 17% by weight of $SrTiO_3$ powder, and 3% by weight of $Al_2O_3$ powder. Then, as an organic binder, 12 parts by weight of acrylic resin and 6 parts by weight of phthalic acid base plasticizer and, as a solvent, 30 parts by weight of toluene are added with respect to 100 parts by weight of the glass ceramic compound. They are blended together by a ball mill technique to form a slurry. The slurry is then formed into a 300 μm-thick glass ceramic green sheet by the conventionally known doctor blade method.

Next, in order to create a ferrite green sheet, a raw material having the same composition as the test sample numbered 1 in Table 1 is adjusted to weigh 1000 g. The constituents of the raw material are blended with 4000 $cm^3$ of pure water for 24 hours in a 7000 $cm^3$-ball mill constructed of a zirconia pulverization ball. Following a fractional drying process, the raw material powder is fired tentatively in a zirconia crucible at a temperature of 730° C. In do doing there is prepared tentatively-fired ferrite powder. After that, 10% by weight of butyral resin and, as a diluent, 45% by weight of alcohol of high molecular weight are added to the ferrite powder thus prepared. They are blended together by a ball mill technique to form a slurry. The slurry is then formed into a 100 μm-thick ferrite green sheet by the doctor blade method.

Note that a conductor paste used for forming the wiring pattern layer 8 was prepared by blending ethylcellulose base resin and terpineol of predetermined amount into Ag powder having an average particle diameter of 2.5 to 3.5 μm, followed by mixing them with use of a three-roll mill until an adequate viscosity is obtained.

Subsequently, the conductor paste is applied onto the glass ceramic green sheet as well as the ferrite green sheet in predetermined patterns. Following a drying process, two pieces of the glass ceramic green sheets are stacked together, and thereon is placed a stack of four pieces of the ferrite green sheets. Moreover, on the stack of the ferrite green sheets is placed a stack of two pieces of the glass ceramic green sheets. The resultant stack is subjected to compression bonding at a temperature of 55° C. and under a pressure of 20 MPa, thereby forming a glass ceramic stacked body.

The glass ceramic stacked body thus obtained is cut into 80 mm-sized test pieces. The test pieces are each provided with 10 mm-spaced division grooves 18 of such a depth as to reach the ferrite layer.

The test piece thus obtained is placed on an alumina ceramic-made setter, and thereon is further placed a weight composed identically with the alumina ceramic-made setter to impose a load of approximately 0.5 MPa. Then, it is heated at a temperature of 500° C. in an air atmosphere for two hours to remove organic substances contained in the test piece, and fired at 900° C. in an air atmosphere for 2 hours. In so doing there was fabricated a glass ceramic substrate of Example 30.

Table 6 shows the results of water absorption measurement performed on the glass ceramic substrate of Example 30.

COMPARATIVE EXAMPLE 4

As Comparative example 4, a test sample was fabricated basically in the same manner as in Example 30, the only difference being that the depth of the division groove 18 is set at 300 μm so that the ferrite layer 7 is not reached by the division groove 18. The results of water absorption measurement performed on the glass ceramic substrate of Comparative example 4 are also given in Table 6.

TABLE 6

| | Water absorption |
|---|---|
| Example 30 | A |
| Comparative example 4 | B |

According to Table 6, Example 30 designed so that the ferrite layer 7 is reached by the division groove 18 exhibits water absorption of less than 0.1%, whereas Comparative example 4 designed so that the ferrite layer 7 is not reached by the division groove 18 exhibits water absorption of 0.1% or above. The reason is that the binding action between the ferrite layer 7 and the ceramic layer 5 can be hindered by the division groove 18 that reaches the ferrite layer 7.

Next, analysis was conducted for the effects of disposing the electrically insulating layer 14 and the sintered metal layer 15 acting as the intermediary layer as shown in FIG. 6.

EXAMPLE 31

Figure 13:
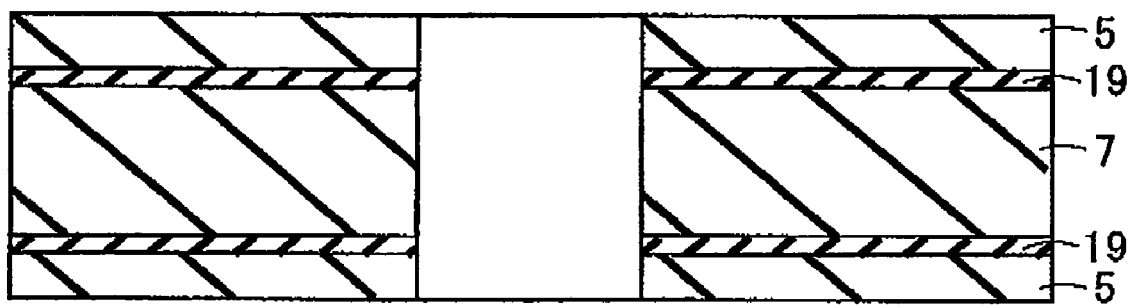
FIG. 13 is a sectional view of a test sample fabricated for the purpose of examining the effects of disposing an intermediary layer.

As Example 31, a ring-shaped test sample having an outer diameter of 16 mm and an inner diameter of 8 mm was fabricated to examine the effects of disposing the intermediary layer. FIG. 13 is a sectional view of the test sample fabricated for the purpose of examining the effects of disposing the intermediary layer. Note that, In FIG. 13, the constituent components that play the same or corresponding roles as in FIG. 6 will be identified with the same reference designations. As shown in FIG. 13, the test sample is composed of the ferrite layer 7, the glass ceramic-made ceramic layers 5 laminated on both sides of the ferrite layer 7, and the intermediary layer 19 interposed between the ceramic layer 5 and the ferrite layer 7. The magnetic permeability of the test sample was measured by means of high-frequency current-voltage method with use of Impedance analyzer (Type HP-4291A: manufactured by Hewlett-Packard Development Company. L. P.).

The test sample was fabricated as follows. At first there is prepared a glass ceramic compound having a composition of 60% by weight of $SiO_2$—$Al_2O_3$—$MgO$—$B_2O_3$—$ZnO$ base glass powder, 20% by weight of $CaZrO_3$ powder, 17% by weight of $SrTiO_3$ powder, and 3% by weight of $Al_2O_3$ powder. Then, as an organic binder, 12 parts by weight of acrylic resin and 6 parts by weight of phthalic acid base plasticizer and, as a solvent, 30 parts by weight of toluene are added with respect to 100 parts by weight of the glass ceramic compound. They are blended together by a ball mill technique to form a slurry. The slurry is then formed into a 300 μm-thick glass ceramic green sheet by the doctor blade method.

Next, in order to create a ferrite green sheet, with use of a raw material having the same composition as the test sample numbered 1 in Table 1, tentatively-fired ferrite powder is prepared basically in the same manner as in Example 1. After that, 10% by weight of butyral resin and, as a diluent, 45% by weight of alcohol of high molecular weight are added to the ferrite powder thus prepared. They are blended together by a ball mill technique to form a slurry. The slurry is then formed into a 80 μm-thick ferrite green sheet by the doctor blade method.

Subsequently, a predetermined number of the glass ceramic green sheets are stacked together, and thereon is placed a stack of a predetermined number of the ferrite green sheets. Moreover, on the stack of the ferrite green sheets is placed a stack of a predetermined number of the glass ceramic green sheets. The resultant stack is subjected to compression bonding at a temperature of 55° C. and under a pressure of 20 MPa, thereby forming a glass ceramic stacked body.

The glass ceramic stacked body thus obtained is placed on an alumina ceramic-made setter, and thereon is further placed a weight composed identically with the alumina ceramic-made setter to impose a load of approximately 0.5 MPa. Then, it is heated at a temperature of 500° C. in an air atmosphere for two hours to remove organic substances contained in the glass ceramic stacked body, and fired at 900° C. in an air atmosphere for 2 hours. In so doing there was fabricated a glass ceramic substrate of Example 31.

The glass ceramic substrate thus obtained showed no signs of warpage and deformation in spite of the fact that it includes the ferrite layer 7 formed so as to occupy the inner-layer portion thereof. The results of magnetic permeability measurement performed on the glass ceramic substrate of Example 31 are given in Table 7.

EXAMPLE 32

As Example 32, a ring-shaped test sample having an outer diameter of 16 mm and an inner diameter of 8 mm was fabricated in analogy to Example 31. A point of difference is that interposed between the ferrite layer and the glass ceramic insulating layer is the electrically insulating layer 14.

In order to create the electrically insulating layer 14, an insulating paste was prepared by blending ethylcellulose base resin and terpineol of predetermined amount into an admixture of 30% by mass of $SiO_2$—$Al_2O_3$—$MgO$—$B_2O_3$—$ZnO$ base glass powder which is identical with that contained in the glass ceramic material and 70% by mass of ferrite powder composed of a crystal phase of $ZnFe_2O_4$, $CuFe_2O_4$, $FeFe_2O_4$, and $NiFe_2O_4$, the average particle diameter of which is 0.5 to 0.7 μm, followed by mixing them with use of a three-roll mill until an adequate viscosity is obtained.

The test sample was fabricated as follows. At first a predetermined number of the glass ceramic green sheets are stacked together. Then, a layer of the insulating paste is formed over the entire surface of the stack. Following a drying process, on the dried insulating paste layer is placed the ferrite green sheet, and a layer of the insulating paste is formed over the entire surface of the ferrite green sheet. Following another drying process, on the dried insulating paste layer is placed a stack of a predetermined number of the glass ceramic green sheets. The resultant stack is subjected to compression bonding at a temperature of 55° C. and under a pressure of 20 MPa, thereby forming a glass ceramic stacked body.

The glass ceramic stacked body thus obtained is placed on an alumina ceramic-made setter, and thereon is further placed a weight composed identically with the alumina ceramic-made setter to impose a load of approximately 0.5 MPa. Then, it is heated at a temperature of 500° C. in an air atmosphere for two hours to remove organic substances contained in the glass ceramic stacked body, and fired at 900° C. in an air atmosphere for 2 hours. In so doing there was fabricated a glass ceramic substrate of Example 32.

The results of magnetic permeability measurement performed on the glass ceramic substrate of Example 32 are given in Table 7.

EXAMPLE 33

As Example 33, a test sample was fabricated basically in the same manner as in Example 32, the only difference being that the sintered metal layer 15 is formed therein instead of the electrically insulating layer 14. The sintered metal layer 15 is composed of 80% by mass of Ag powder (average particle diameter: 1.0 μm) and 20% by mass of $SiO_2$—$Al_2O_3$—MgO—$B_2O_3$—ZnO base glass powder. The results of magnetic permeability measurement performed on the glass ceramic substrate of Example 33 are also given in Table 7.

EXAMPLE 34

As Example 34, a test sample was fabricated basically in the same manner as in Example 32, the only difference being that the sintered metal layer 15 is formed in addition to the electrically insulating layer 14. The sintered metal layer 15 is composed of 80% by mass of Ag powder (average particle diameter: 1.0 μm) and 20% by mass of $SiO_2$—$Al_2O_3$—MgO—$B_2O_3$—ZnO base glass powder. The results of magnetic permeability measurement performed on the glass ceramic substrate of Example 34 are also given in Table 7.

TABLE 7

|  | Magnetic permeability (1 MHz) | Magnetic permeability (10 MHz) |
| --- | --- | --- |
| Example 31 | 400 | 350 |
| Example 32 | 460 | 370 |
| Example 33 | 470 | 370 |
| Example 34 | 490 | 390 |

As will be understood from Table 7, the ferrite layer formed inside the glass ceramic substrate of any of the test samples fulfills the necessary conditions for the target ferrite characteristics: a sintered density of 5 g/cm³ or above and magnetic permeability of 100 or above as observed at 1.0 MHz and 10.0 MHz.

Moreover, Examples 32 to 34 having the electrically insulating layer 14 and/or the sintered metal layer 15 interposed between the ferrite layer and the glass ceramic insulating layer are superior to Example 31 in point of magnetic permeability. This is because, in Examples 32 to 34, the electrically insulating layer 14 and/or the sintered metal layer 15 serve/serves to alleviate the stress exerted between the ferrite layer and the glass ceramic layer, wherefore magnetic distortion which is developed in the ferrite layer 7 can be suppressed.

It should be noted that the invention is not limited to the embodiments and examples as described hereinabove, and therefore various changes and modifications may be made without departing from the spirit and scope of the claimed invention. For example, in the above-described embodiments, Ag is used to form the wiring pattern layer 8, but Cu, Au, Ag—Pd alloy, or the like may be employed instead.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A ceramic substrate comprising:
   a plurality of ceramic layers formed of a non-magnetic material;
   a ferrite layer formed of ferrite material formed of ferrite containing $Fe_2O_3$, CuO, NiO, and ZnO,
   wherein the following formulae are satisfied:

$63 \leq a \leq 73$, $5 \leq b \leq 10$, $5 \leq c \leq 12$, $10 \leq d \leq 23$, and $a+b+c+d \leq 100$, where a content of $Fe_2O_3$ is a % by mass, a content of CuO is b % by mass, a content of NiO is c % by mass, a content of ZnO is d % by mass,
   wherein said ferrite layer is interposed in the plural ceramic layer; and
   a coil-shaped conductor layer embedded in the ferrite layer.

2. The ceramic substrate of claim 1, wherein a ferrite portion located inwardly from an innermost part of the coil-shaped conductor layer as well as a ferrite portion located outwardly from an outermost part of the coil-shaped conductor layer is greater in magnetic permeability than a ferrite portion located between the adjacent parts of the coil-shaped conductor layer, when viewed in a plane-wise direction.

3. The ceramic substrate of claim 1, wherein an electromagnetic shielding layer is interposed between the ferrite layer and a ceramic layer adjoining to the ferrite layer.

4. The ceramic substrate of claim 3, wherein the electromagnetic shielding layers are so formed as to cover the coil in the direction of thickness of the substrate.

5. The ceramic substrate of claim 1, wherein the ferrite layer is so designed that its outer periphery is lower in void ratio than other part located inwardly from the outer periphery, as seen plane-wise.

6. The ceramic substrate of claim 1, wherein, in the ferrite layer, a plurality of coil-shaped conductor layers are arranged in a face-to-face manner, with a spacing secured therebetween, when viewed in the direction of thickness of the substrate, and the plural coil-shaped conductor layers are electrically connected in parallel with each other.

7. The ceramic substrate of claim 6, wherein a ferrite portion that exists between the outermost part of each of the plural coil-shaped conductor layers and the innermost part of each of the plural coil-shaped conductor layers, when viewed in a plane-wise direction, as well as exists in a coil-forming region secured between the plural coil-shaped conductor layers, when viewed in a thickness-wise direction, is smaller in magnetic permeability than a ferrite portion that exists in other region than the coil-forming region of the ferrite layer.

8. The ceramic substrate of claim 1, wherein the coil-shaped conductor layer is predominantly composed of at least one kind of metal selected from among Cu, Ag, Au, Pt, Al, Ag—Pd alloy, and Ag—Pt alloy.

9. The ceramic substrate of claim 1, wherein the ferrite layer is formed of non-magnetic ferrite, and on the outer surface of the ceramic layer is formed a metallized wiring layer made of a material containing divalent metal oxide as an additional constituent.

10. The ceramic substrate of claim 9, wherein the metallized wiring layer is composed of at least one kind of metal selected from among Cu, Ag, Au, Pt, Al, Ag—Pd alloy, and Ag—Pt alloy as a major constituent, and at least one kind of metal oxide selected from CuO and ZnO as an additional constituent.

11. The ceramic substrate of claim 10, wherein the metallized wiring layer is made of a material containing CuO or ZnO as an additional constituent, and that the content of CuO or ZnO is adjusted to fall in a range of from 5 to 15 parts by mass with respect to 100 parts by mass of the major-constituent metal.

12. The ceramic substrate of claim 11, wherein the metallized wiring layer is made of a material containing CuO and ZnO as additional constituents, and that the content of CuO plus ZnO is adjusted to fall in a range of from 5 to 15 parts by mass with respect to 100 parts by mass of the major-constituent metal.

13. The ceramic substrate of claim 1, wherein the ceramic layer is made of glass ceramic,
   an intermediary layer is interposed between the ferrite layer and the ceramic layer adjoining to the ferrite layer, and
   the intermediary layer is formed of an electrical insulator composed of glass and the same constituent as that contained in the ferrite layer, the thermal expansion coefficient of which falls in between the thermal expansion coefficient of the ceramic layer and the thermal expansion coefficient of the ferrite layer.

14. The ceramic substrate of claim 1, wherein the ceramic layer is made of glass ceramic,
   an intermediary layer is interposed between the ferrite layer and the ceramic layer adjoining to the ferrite layer, and
   the intermediary layer is formed of a sintered metal layer composed of glass and at least one kind of metal selected from among Cu, Ag, Au, Pt, Ag—Pd alloy, and Ag—Pt alloy.

* * * * *